(12) United States Patent
Nara et al.

(10) Patent No.: US 7,958,934 B2
(45) Date of Patent: Jun. 14, 2011

(54) COUNTER-STREAM-MODE OSCILLATING-FLOW HEAT TRANSPORT APPARATUS

(75) Inventors: Kenichi Nara, Obu (JP); Yasumasa Hagiwara, Kariya (JP); Kimio Kohara, Nagoya (JP); Shinichi Yatsuzuka, Chiryu (JP); Seiji Inoue, Nukata-gun (JP)

(73) Assignee: Denso Corporation, Kariya (JP)

( * ) Notice: Subject to any disclaimer, the term of this patent is extended or adjusted under 35 U.S.C. 154(b) by 284 days.

(21) Appl. No.: 12/231,980

(22) Filed: Sep. 8, 2008

(65) Prior Publication Data
US 2009/0014162 A1 Jan. 15, 2009

Related U.S. Application Data

(60) Continuation of application No. 11/472,255, filed on Jun. 21, 2006, now abandoned, which is a division of application No. 10/634,341, filed on Aug. 5, 2003, now abandoned.

(30) Foreign Application Priority Data

Aug. 7, 2002 (JP) .................................. 2002-229993
Mar. 13, 2003 (JP) ................................. 2003-067928
Jun. 12, 2003 (JP) ................................. 2003-167657

(51) Int. Cl.
*F28F 7/00* (2006.01)
*H05K 7/20* (2006.01)

(52) U.S. Cl. .................................. 165/80.4; 165/104.28

(58) Field of Classification Search .................. 165/148, 165/80.4, 104.22, 104.28, 104.21; 361/699, 361/700; 257/714, 715
See application file for complete search history.

(56) References Cited

U.S. PATENT DOCUMENTS

| | | | |
|---|---|---|---|
| 3,681,843 A | 8/1972 | Arcella et al. ................... 29/423 |
| 4,765,397 A | 8/1988 | Chrysler et al. | |
| 4,884,630 A | 12/1989 | Nelson et al. | |
| 5,076,351 A * | 12/1991 | Munekawa et al. ...... 165/104.21 |
| 5,205,353 A | 4/1993 | Willemsen et al. | |
| 5,219,020 A * | 6/1993 | Akachi .................... 165/104.26 |
| 5,238,056 A * | 8/1993 | Scotti et al. ................ 165/109.1 |
| 5,275,002 A | 1/1994 | Inoue et al. ......................... 62/6 |

(Continued)

FOREIGN PATENT DOCUMENTS

JP 49-46344 12/1974

(Continued)

OTHER PUBLICATIONS

Korean Notice of Preliminary Rejection dated Jul. 29, 2005 in corresponding Korean Application No. 10-2003-0054079 with English translation.

(Continued)

*Primary Examiner* — Tho v Duong
(74) *Attorney, Agent, or Firm* — Harness, Dickey & Pierce, PLC

(57) ABSTRACT

A counter-stream-mode oscillating-flow heat transport apparatus improves heat transport capability by imparting oscillatory displacement to a fluid located near a heat-generating element such that the fluid is directed toward the heat-generating element. Turning portions of serpentine flow paths are disposed to face the heat-generating element. The flow paths are stacked in multiple layers in the direction from the heat-generating element to the flow paths, and a plurality of flow paths are disposed adjacent to the heat-generating element in the direction of fluid oscillation.

5 Claims, 27 Drawing Sheets

U.S. PATENT DOCUMENTS

| | | | |
|---|---|---|---|
| 5,295,355 A | 3/1994 | Zhou et al. | 62/6 |
| 5,697,428 A | 12/1997 | Akachi | |
| 5,841,244 A | 11/1998 | Hamilton et al. | |
| 5,901,037 A | 5/1999 | Hamilton et al. | |
| 6,041,850 A | 3/2000 | Esser et al. | 165/104.33 |
| 6,101,715 A | 8/2000 | Fuesser et al. | |
| 6,137,682 A * | 10/2000 | Ishimine et al. | 361/704 |
| 6,189,601 B1 * | 2/2001 | Goodman et al. | 165/80.3 |
| 6,229,704 B1 * | 5/2001 | Hoss et al. | 361/704 |
| 6,253,835 B1 | 7/2001 | Chu et al. | |
| 6,301,109 B1 | 10/2001 | Chu et al. | |
| 6,337,794 B1 | 1/2002 | Agonafer et al. | |
| 6,388,882 B1 * | 5/2002 | Hoover et al. | 361/704 |
| 6,397,935 B1 | 6/2002 | Yamamoto et al. | |
| 6,443,222 B1 | 9/2002 | Yun et al. | |
| 6,504,721 B1 * | 1/2003 | Watwe et al. | 361/700 |
| 6,655,450 B2 | 12/2003 | Nishio et al. | |
| 7,080,680 B2 * | 7/2006 | Ota et al. | 165/80.2 |
| 2002/0056542 A1 | 5/2002 | Yamamoto et al. | |
| 2002/0189792 A1 | 12/2002 | Nishio et al. | 165/104.21 |
| 2003/0037910 A1 | 2/2003 | Smyrnov | |
| 2003/0121644 A1 | 7/2003 | Tonosaki et al. | |

FOREIGN PATENT DOCUMENTS

| | | |
|---|---|---|
| JP | 60-133290 | 7/1985 |
| JP | 61-250490 | 7/1986 |
| JP | 03-144291 | 6/1991 |
| JP | 07-063487 | 3/1995 |
| JP | 07-153881 | 6/1995 |
| JP | 08-125366 | 5/1996 |
| JP | 08-247692 | 9/1996 |
| JP | 09-061074 | 3/1997 |
| JP | 10-038484 | 2/1998 |
| JP | 11-017375 | 1/1999 |
| JP | 11-202979 | 7/1999 |
| JP | 11-325764 | 11/1999 |
| JP | 2000-180079 | 6/2000 |
| JP | 2001-082887 | 3/2001 |
| JP | 2001-165582 | 6/2001 |
| JP | 2001-223309 | 8/2001 |
| JP | 2001-241868 | 9/2001 |
| JP | 2001-336889 | 12/2001 |
| JP | 2002-013888 | 1/2002 |
| JP | 2002-195789 | 7/2002 |
| JP | 2002-286381 | 10/2002 |
| JP | 2002-289995 | 10/2002 |
| JP | 2002-314281 | 10/2002 |

OTHER PUBLICATIONS

Office Action dated Jun. 25, 2007 in corresponding Japanese Application No. 2003-067928 with English translation.

Office Action dated Oct. 16, 2007 in corresponding Japanese Application No. 2003-067928 with English translation.

Office Action dated Nov. 6, 2007 in corresponding Japanese Application No. 2003-167657 with English translation.

Office Action dated Dec. 21, 2007 in corresponding Japanese Application No. 2003-178128 with English translation.

* cited by examiner

----> DIRECTION
<---- OF FLOW

----> DIRECTION
<---- OF FLOW

---> DIRECTION OF FLOW

---> DIRECTION OF FLOW

---> DIRECTION
<--- OF FLOW

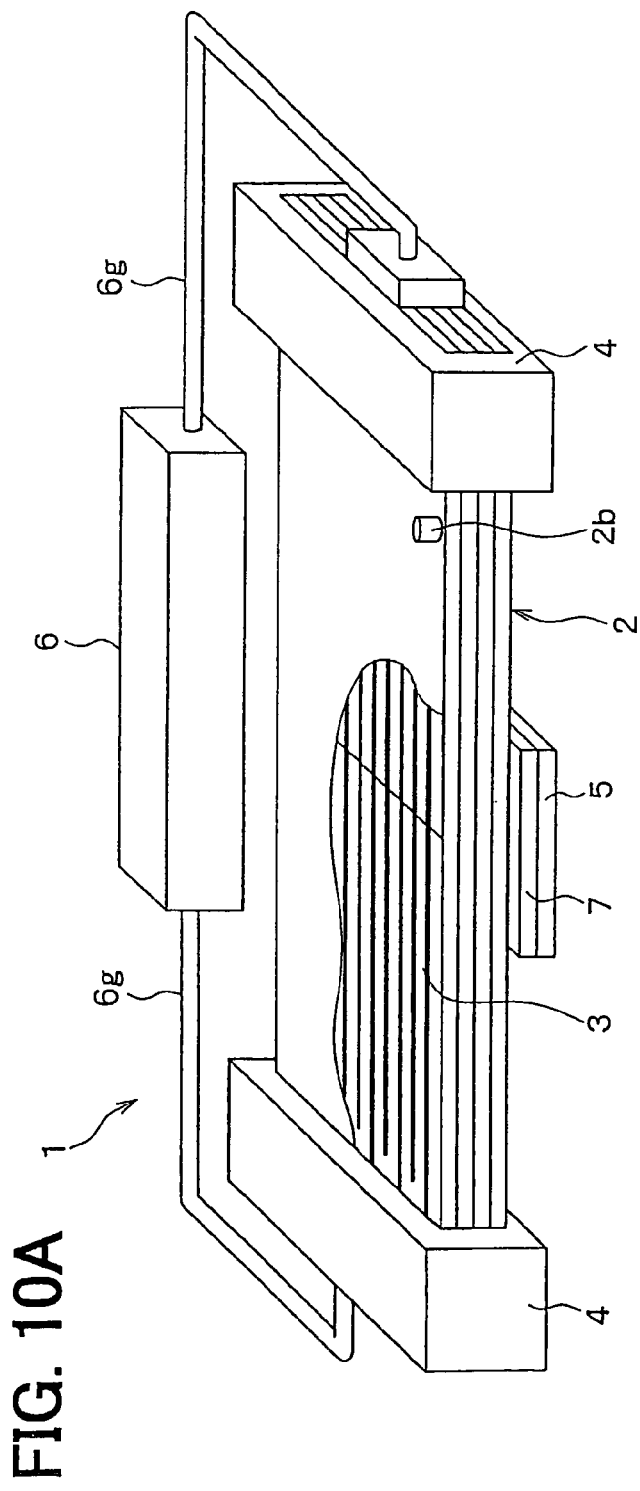
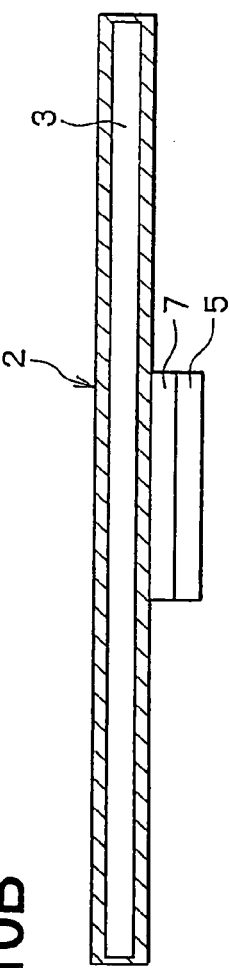
FIG. 10A
FIG. 10B

HEAT-GENERATING PORTION
DIRECTION OF FLOW PATH
HEAT-RADIATING PORTION

SECTION OF SIDE FLOW PATH AT HEAT-GENERATING PORTION

SECTION OF SIDE FLOW PATH AT HEAT-RADIATING PORTION

HEAT GENERATING ELEMENT 5

HEAT GENERATING ELEMENT 5

FIG. 34A
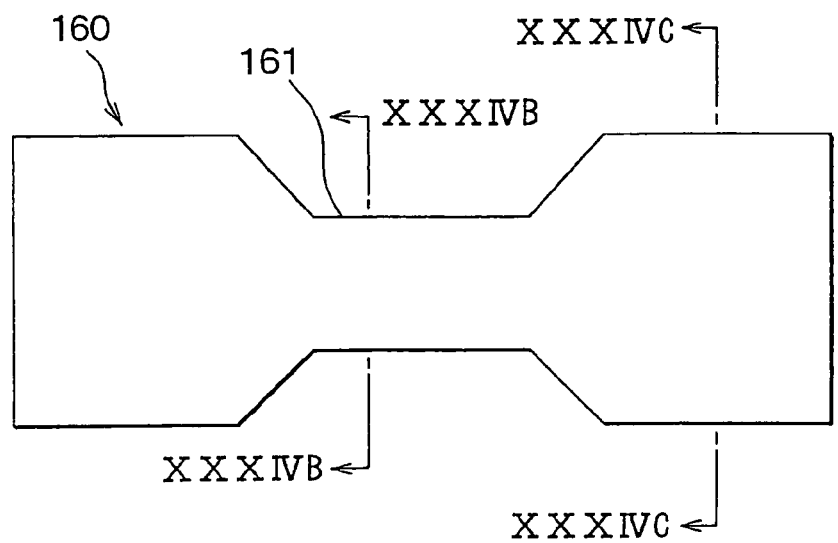
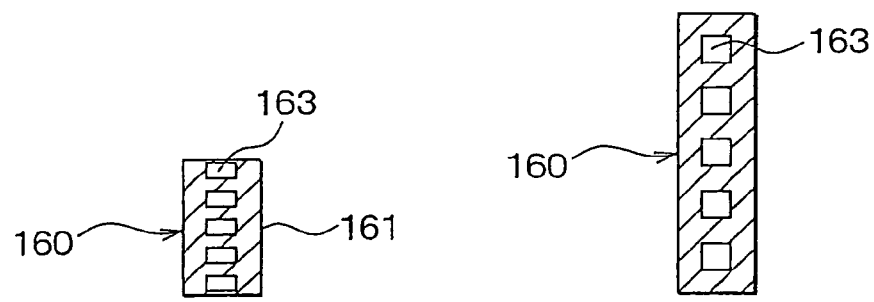
FIG. 34B          FIG. 34C

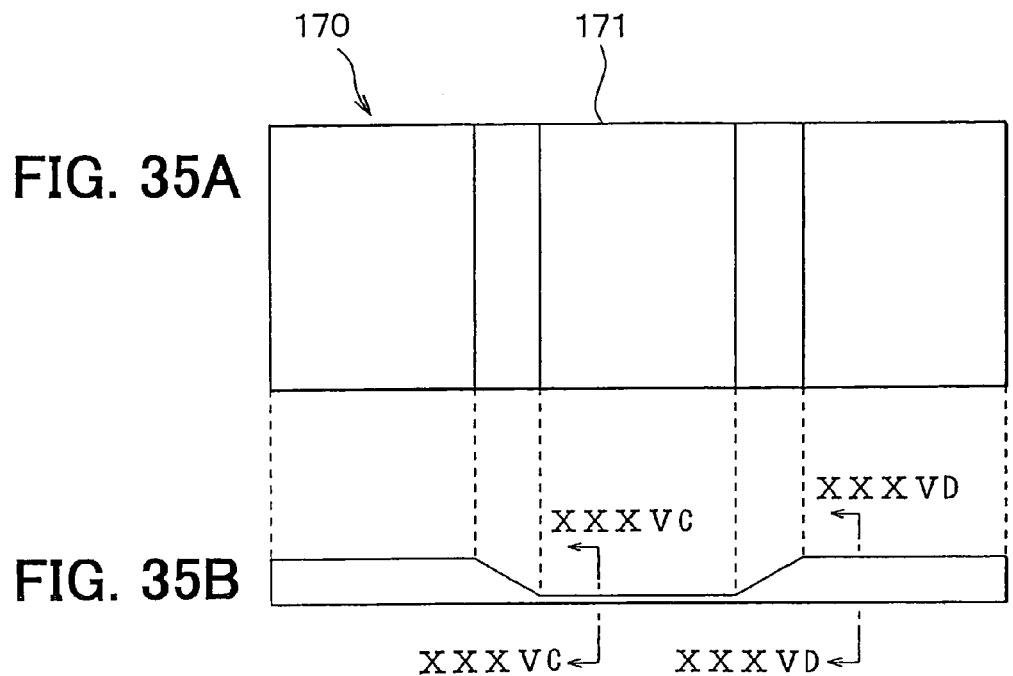
FIG. 35A
FIG. 35B
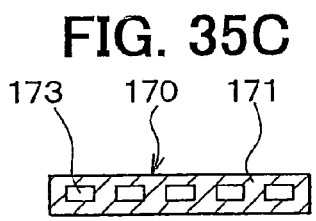
FIG. 35C
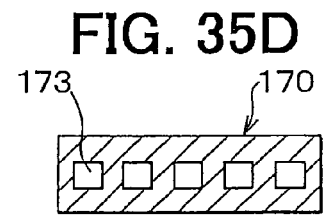
FIG. 35D
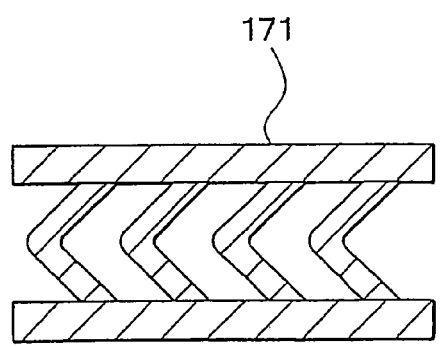
FIG. 36A
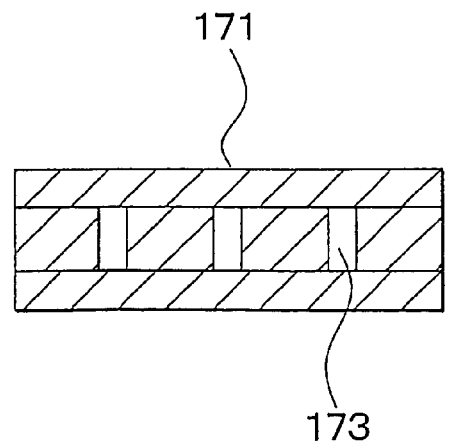
FIG. 36B

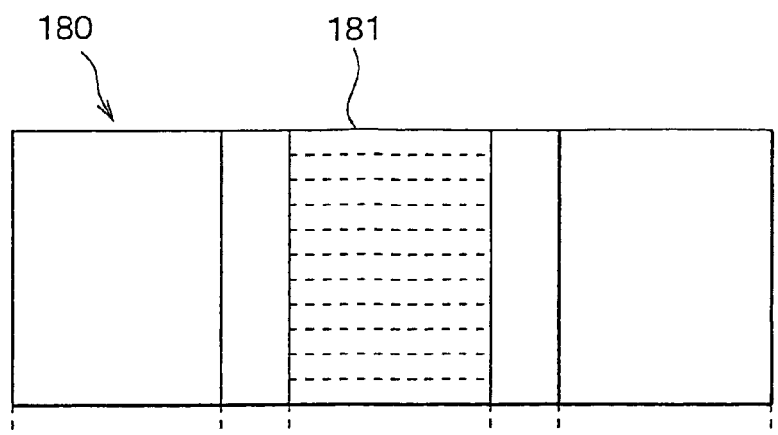
FIG. 37A
FIG. 37B
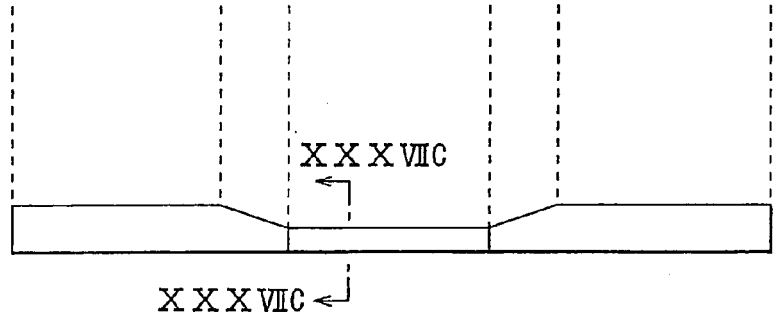
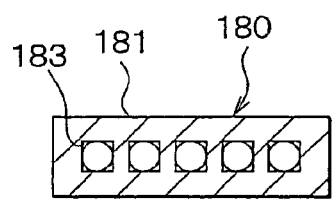
FIG. 37C
FIG. 38A
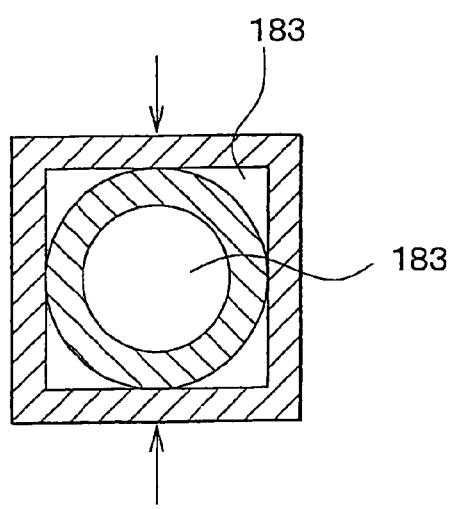
FIG. 38B
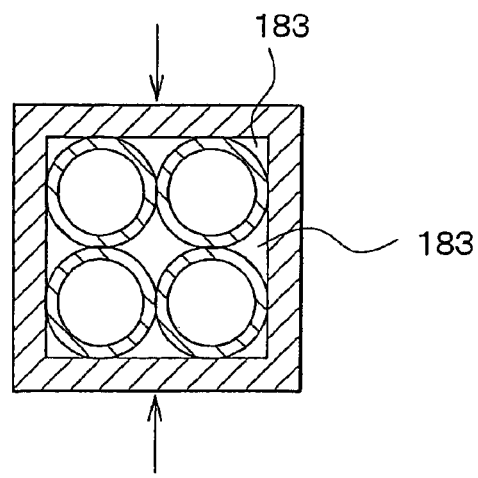

COUNTER-STREAM-MODE OSCILLATING-FLOW HEAT TRANSPORT APPARATUS

CROSS REFERENCE TO RELATED APPLICATIONS

This application is a continuation of U.S. patent application Ser. No. 11/472,255 filed Jun. 21, 2006, which is a divisional application of U.S. patent application Ser. No. 10/634,341 filed Aug. 5, 2003 which is based upon, claims the benefit of priority of, and incorporates by reference, the contents of Japanese Patent Applications No. 2002-229993 filed Aug. 7, 2002, No. 2003-67928 filed Mar. 13, 2003, and No. 2003-167657 filed Jun. 12, 2003.

BACKGROUND OF THE INVENTION

1. Field of the Invention

The present invention relates to a counter-stream-mode oscillating-flow heat transport apparatus which creates oscillations of counterflow fluid mediums in adjacent flow paths and microchannels to thereby exchange heat between the adjacent flow paths and transport heat from a hot region to a cold region, the apparatus being effectively applicable to a thermally quasi-superconductive plate, a thermal switch, a thermal diode, and so forth.

2. Description of the Related Art

As can be found in the URL, "http://www.iis.u-tokyo.ac.jp/topics/1nishio.html," dated May 31, 2002, the counter-stream-mode oscillating-flow heat transport apparatus is based on a principle that employs no phase change. The principle of transferring heat in the counter-stream-mode oscillating-flow heat transport apparatus relies on the so-called "enhanced heat diffusion effect" which is produced by oscillating flows, as described in the aforementioned URL.

To describe the effect in more detail, suppose that a liquid-filled conduit has a temperature distribution as shown in FIG. 22. For simplicity, consider a rectangular wave oscillation in which an oscillation of the liquid stays at point H for half a cycle and is then immediately transferred to point L and stays there for the other half cycle, and is then immediately transferred back to point H.

Take a liquid portion, referred to as an element, at point C in absence of oscillation. When this element is oscillated to move to point H, the element accepts heat from the wall of the conduit because the temperature at point H on the wall is higher than that of the element. When the element is further oscillated to move to point L, the element releases heat to the wall since the temperature at point L on the wall is lower than that of the element.

In other words, one oscillation causes heat to be transferred from point H to point L, like a frog jumps from one place to another. Such a jump would never occur in absence of an oscillation. Furthermore, the heat transfer or "jump" occurs simultaneously with the oscillation. Thus, the higher the frequency of the oscillation, the larger the number of jumps per unit time becomes, while the larger the amplitude, the greater the distance a jump becomes. That is, the accompanying displacement of heat due to the jump increases with an increase in amplitude and cyclical action. However, an increase in amplitude and cyclical action for a greater amount of heat displacement would cause an increase in the flow path resistance the pump load for inducing oscillation in a liquid.

To effectively release heat from a heat-generating element having high heat fluxes, it is critical to provide an improved coefficient of heat transfer with a heating medium (such as water or air). The improvement in the heat transfer coefficient can be achieved by allowing the heating medium to flow through a microchannel (micro-machined) flow path.

Accordingly, the higher the frequency of the oscillation, the larger the number of jumps per unit time becomes, and the larger the amplitude, the greater the distance of a jump. Thus, the accompanying displacement of heat provided by the jump increases with an increase in amplitude and cycle (e.g., see Japanese Patent Laid-Open Publication No. 2002-364991).

On the other hand, the counter-stream-mode oscillating-flow heat transport apparatus induces oscillations in a fluid through a serpentine flow path to thereby create oscillations of counterflow fluids in adjacent flow paths, and thus the apparatus has to be provided with serpentine flow paths. In this context, the inventors devised the following two methods for manufacturing the serpentine flow paths.

That is, as shown in FIG. 47, according to a first manufacturing method, there is provided a multi-hole tube 41 having a plurality of holes 46 formed to penetrate from one end to the other end along the length of the tube. Plates 51 are also provided which each have recesses 50 for allowing adjacent holes 46 to communicate with each other and which are coupled to both ends of the multi-hole tube 41.

On the other hand, as shown in FIG. 48, according to the second manufacturing method, there is also provided a multi-hole tube 41 having a plurality of holes 46 formed to penetrate from one end to the other end along the length thereof. The multi-hole tube 41 is constructed such that bounding walls for defining a boundary of adjacent holes 46 are alternately cut or formed in a similar manner at both the longitudinal ends thereof so as to allow adjacent holes 46 to communicate with each other inside the multi-hole tube 41 at the longitudinal ends. The longitudinal ends of the multi-hole tube 41 are each blocked with a strip plate 52.

However, the first manufacturing method requires the plates 51 having the recesses 50 provided at a plurality of portions therein to be separately manufactured. The plates 51 having the recesses 50 provided at a plurality of portions therein are complicated in shape. This leads to an increase in manufacturing costs of the counter-stream-mode oscillating-flow heat transport apparatus.

The second manufacturing method requires an additional process of alternately cutting the bounding walls at the longitudinal ends thereof, or the like, after the multi-hole tube 41 has been fabricated. This also results in an increase in manufacturing costs of the counter-stream-mode oscillating-flow heat transport apparatus.

Like the condenser tube employed in a vehicular air conditioner, the multi-hole tube has a plurality of holes 46 formed to penetrate from one end to the other end along its length and can be fabricated by an extrusion process or by a drawing process. Although the microchannel has a high heat transfer coefficient, its reduced flow path area leads to a high pressure loss. This raises a problem that a high power pump is required for the heating medium to circulate through the flow path. Furthermore, the microchannel is typically fabricated by cutting or etching; however, these methods lead to an increase in manufacturing costs for the microchannel.

SUMMARY OF THE INVENTION

The present invention was developed in view of the aforementioned problems. It is therefore a first object of the invention to provide a new counter-stream-mode oscillating-flow heat transport apparatus that improves heat transport capability when compared with the prior art. A second object is to provide a counter-stream-mode oscillating-flow heat transport apparatus that is capable of being manufactured more efficiently and at a lower cost than the prior art.

To achieve the aforementioned objects, according to a first aspect of the present invention, a counter-stream-mode oscillating-flow heat transport apparatus induces oscillations of counterflow fluids in adjacent flow paths (3) to thereby exchange heat between the adjacent flow paths (3) and transport heat from a hot region to a cold region, that is, from a hot side of a device to a cold side. The apparatus is characterized in that oscillatory displacement is imparted to a fluid of the fluids in the flow paths (3), the fluid being located near a heat source (5), such that the fluid is directed toward the heat source (5).

This allows oscillations and turbulence to be induced in the fluid at a portion in the flow paths (3) corresponding to the heat source (5), thereby providing an increased coefficient of heat transfer between the heat source (5) and the fluid by the turbulent effect by which a cold fluid collides intermittently against the portion corresponding to the heat source (5). In contrast to this, the prior art counter-stream-mode oscillating-flow heat transport apparatus does not provide oscillatory movements in a manner such that the fluid would collide against the heat source (5) at the portion of the flow paths corresponding to the heat-generating element, thus essentially providing no turbulent effect and a lower coefficient of heat transfer than this embodiment.

As described above, this aspect enables a larger amount of heat to be collected from the heat source (5) in a short period of time than the prior art counter-stream-mode oscillating-flow heat transport apparatus. This aspect thus provides a new counter-stream-mode oscillating-flow heat transport apparatus which is different from the prior art and provides improved heat transport capability when compared with the prior art counter-stream-mode oscillating-flow heat transport apparatus.

The invention according to a second aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a bounding portion for defining a boundary of at least the adjacent flow paths (3) of the flow paths (3) is bent. This makes it possible to obtain a new counter-stream-mode oscillating-flow heat transport apparatus that is different from the prior art while preventing the counter-stream-mode oscillating-flow heat transport apparatus from being increased in size.

The invention according to a third aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a plurality of the flow paths (3) are disposed adjacent to a heat source (5) in a direction of fluid oscillation.

The fluid exchanges heat with the heat source (5) at a portion of the flow paths (3) corresponding to the heat source (5) in a manner such that the greater the difference in temperature between the fluid and the heat source (5), the more the linear increase in the quantity of heat exchange becomes. In contrast to this, the quantity of heat exchange is not linearly increased as the opposing area between the heat source (5) and the fluid increases, but reaches a saturation point against the increase in the opposing area.

That is, a maximum temperature difference $\Delta T$ is given between the fluid and the heat source (5) at an end of the heat source (5). However, since the quantity of heat exchange is reduced exponentially in response to an increase in the opposing area between the heat source (5) and the fluid, an increase in the quantity of heat exchange through the opposing area between the heat source (5) and the fluid will become saturated.

Here, the prior art counter-stream-mode oscillating-flow heat transport apparatus employs one flow path (3) adjacent to the heat source (5) in the direction of fluid oscillation, whereas the counter-stream-mode oscillating-flow heat transport apparatus, according to an aspect of the present invention, employs a plurality of flow paths (3) adjacent to the heat source (5) in the direction of fluid oscillation. Suppose that both the prior art counter-stream-mode oscillating-flow heat transport apparatus and the counter-stream-mode oscillating-flow heat transport apparatus according to the present aspect have the same total opposing area.

In this case, the counter-stream-mode oscillating-flow heat transport apparatus according to an aspect of the present invention has a smaller opposing area per one piece than the prior art counter-stream-mode oscillating-flow heat transport apparatus. However, as described above, the increase in the quantity of heat exchange through the opposing area is saturated. Thus, even for a reduced opposing area per one piece, the arrangement with a plurality of flow paths (3) adjacent to the heat source (5) can provide, as a whole, an increased quantity of heat to be absorbed from the heat source (5). Accordingly, it is possible to obtain a new counter-stream-mode oscillating-flow heat transport apparatus which is different from the prior art and which ensures an improved heat transport capability while preventing the counter-stream-mode oscillating-flow heat transport apparatus from increasing in size.

The invention according to a fourth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a heat reservoir (7) for accumulating heat is disposed between a heat source (5) and the flow path (3) having a fluid therein for absorbing heat from the heat source (5).

To collect heat from the heat source (5) with a high degree of efficiency, a large temperature difference $\Delta T$ is required between the heat source (5) and the fluid. However, oscillatory displacements and turbulence in the fluid at a portion of the flow paths (3) corresponding to the heat source (5) lead to a sudden variation in the temperature difference $\Delta T$ in a short period of time. Therefore, a relatively low frequency of oscillation is required of the fluid in order to prevent a sudden variation in the temperature of the heat source (5) in a short period of time; however, it is difficult for this means to ensure an improved heat transport capability.

In contrast to this, the present aspect is provided with the heat reservoir (7) between the heat source (5) and the flow path (3) present in which is the fluid that absorbs heat from the heat source (5). The heat reservoir (7) serves as a buffer for accommodating changes in temperature although the heat transfer from the heat source (5) to the fluid is retarded by the heat reservoir (7), thereby making it possible to provide an increased frequency of oscillation for the fluid.

Accordingly, since the frequency of oscillation of the fluid can be increased, it is possible to increase the total quantity of heat transport even when the heat transfer from the heat source (5) to the fluid is retarded by the heat reservoir (7). It is also possible to obtain a new counter-stream-mode oscillating-flow heat transport apparatus which is different from the prior art and increases the total quantity of heat transport while reducing variations in temperature of the heat source (5).

The invention according to a fifth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that the flow paths (3) are formed of a plurality of flow paths (3) extending in multiple directions.

This makes it possible to obtain a new counter-stream-mode oscillating-flow heat transport apparatus which is different from the prior art and which provides an increased area contributing to heat exchange between adjacent flow paths (3) thereby ensuring an improvement in the heat transport capability while preventing the counter-stream-mode oscillating-flow heat transport apparatus from increasing in size.

The invention according to a sixth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a bounding portion for defining a boundary of at least the adjacent flow paths (3) of the flow paths (3) is bent. Furthermore, oscillatory displacement is imparted to a fluid of the fluids in the flow paths (3), the fluid being located near a heat source (5), such that the fluid is directed toward the heat source (5). More specifically, this aspect is a combination of the first and second aspects.

The invention according to a seventh aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a plurality of the flow paths (3) are disposed adjacent to a heat source (5) in a direction of fluid oscillation and oscillatory displacement is imparted to a fluid of the fluids in the flow paths (3). The fluid is located near the heat source (5), such that the fluid is directed toward the heat source (5). More specifically, this aspect is a combination of the first and third aspects.

The invention according to an eighth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a heat reservoir (7) for accumulating heat is disposed between a heat source (5) and the flow path (3) having a fluid therein for absorbing heat from the heat source (5). Oscillatory displacement is imparted to a fluid of the fluids in the flow paths (3), the fluid being located near the heat source (5), such that the fluid is directed toward the heat source (5). More specifically, this invention is a combination of the first and fourth aspects.

The invention according to a ninth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that the flow paths (3) are formed of a plurality of flow paths (3) extending in multiple directions. Oscillatory displacement is imparted to a fluid of the fluids in the flow paths (3), the fluid being located near a heat source (5), such that the fluid is directed toward the heat source (5). More specifically, this aspect is a combination of the first and fifth aspects.

The invention according to a tenth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a bounding portion for defining a boundary of at least the adjacent flow paths (3) of the flow paths (3) is bent. Furthermore, a plurality of the flow paths (3) are disposed adjacent to a heat source (5) in a direction of fluid oscillation. More specifically, this aspect is a combination of the second and third aspects.

The invention according to an eleventh aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a bounding portion for defining a boundary of at least the adjacent flow paths (3) of the flow paths (3) is bent. Furthermore, a heat reservoir (7) for accumulating heat is disposed between a heat source (5) and the flow path (3) having a fluid therein for absorbing heat from the heat source (5). More specifically, this invention is a combination of the second and fourth aspects.

The invention according to a twelfth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a bounding portion for defining a boundary of at least the adjacent flow paths (3) of the flow paths (3) is bent. The flow paths (3) are formed of a plurality of flow paths (3) extending in multiple directions. More specifically, this invention is a combination of the second and fifth aspects.

The invention according to a thirteenth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a plurality of flow paths (3) are disposed adjacent to a heat source (5) in a direction of fluid oscillation. Furthermore, a heat reservoir (7) for accumulating heat is disposed between the heat source (5) and the flow path (3) having a fluid therein for absorbing heat from the heat source (5). More specifically, this invention is a combination of the third and fourth aspects.

The invention according to a fourteenth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a plurality of the flow paths (3) are disposed adjacent to a heat source (5) in a direction of fluid oscillation. Furthermore, the flow paths (3) are formed of a plurality of flow paths (3) extending in multiple directions. More specifically, this aspect is a combination of the third and fifth aspects.

The invention according to a fifteenth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a heat reservoir (7) for accumulating heat is disposed between a heat source (5) and the flow path (3) having a fluid therein for absorbing heat from the heat source (5), while the flow paths (3) are formed of a plurality of flow paths (3) extending in multiple directions. More specifically, this aspect is a combination of the fourth and fifth aspects.

The invention according to a sixteenth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a bounding portion for defining a boundary of at least the adjacent flow paths (3) of the flow paths (3) is bent. Furthermore, a plurality of the flow paths (3) are disposed adjacent to a heat source (5) in a direction of fluid oscillation and oscillatory displacement is imparted to a fluid of the fluids in the flow paths (3). The fluid is located near the heat source (5) such that the fluid is directed toward the heat source (5). More specifically, this aspect is a combination of the first, second and third aspects.

The invention according to a seventeenth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a bounding portion for defining a boundary of at least the adjacent flow paths (3) of the flow paths (3) is bent. Moreover, a heat reservoir (7) for accumulating heat is disposed between a heat source (5) and the flow path (3) having a fluid therein for absorbing heat from the heat source (5). Additionally, oscillatory displacement is imparted to a fluid of the fluids in the flow paths (3), the fluid being located near the heat source (5), such that the fluid is directed toward the heat source (5). More specifically, this aspect is a combination of the first, second and fourth aspects.

The invention according to an eighteenth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a bounding portion for defining a boundary of at least the adjacent flow paths (3) of the flow paths (3) is bent. Furthermore, the flow paths (3) are formed of a plurality of flow paths (3) extending in multiple directions and oscillatory displacement is imparted to a fluid of the fluids in the flow paths (3). The fluid is located near a heat source (5), such that the fluid is directed toward the heat source (5). More specifically, this aspect is a combination of the first, second and fifth aspects.

The invention according to a nineteenth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a plurality of the flow paths (3) are disposed adjacent to a heat source (5) in a direction of fluid oscillation. A heat reservoir (7) for accumulating heat is disposed between the heat source (5) and the flow path (3) having a fluid therein for absorbing heat from the heat source (5), and oscillatory displacement is imparted to a fluid of the fluids in the flow paths (3), the fluid being located near the heat source (5) such that the fluid is directed toward the heat source (5). More specifically, this aspect is a combination of first, third, and fourth aspects.

The invention according to a twentieth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a plurality of the flow paths (3) are disposed adjacent to a heat source (5) in a direction of fluid oscillation. The flow paths (3) are formed of a plurality of flow paths (3) extending in multiple directions, and oscillatory displacement is imparted to a fluid of the fluids in the flow paths (3), the fluid being located near the heat source (5), such that the fluid is directed toward the heat source (5). More specifically, this aspect is a combination of the first, third, and fifth aspects.

The invention according to a twenty-first aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a heat reservoir (7) for accumulating heat is disposed between a heat source (5) and the flow path (3) having a fluid therein for absorbing heat from the heat source (5). The flow paths (3) are formed of a plurality of flow paths (3) extending in multiple directions, and oscillatory displacement is imparted to a fluid of the fluids in the flow paths (3), the fluid being located near the heat source (5), such that the fluid is directed toward the heat source (5). More specifically, this aspect is a combination of the first, fourth, and fifth aspects.

The invention according to a twenty-second aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a bounding portion for defining a boundary of at least the adjacent flow paths (3) of the flow paths (3) is bent. A plurality of the flow paths (3) are disposed adjacent to a heat source (5) in a direction of fluid oscillation, and a heat reservoir (7) for accumulating heat is disposed between the heat source (5) and the flow path (3) having a fluid therein for absorbing heat from the heat source (5). More specifically, this aspect is a combination of the second, third, and fourth aspects.

The invention according to a twenty-third aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a bounding portion for defining a boundary of at least the adjacent flow paths (3) of the flow paths (3) is bent. A plurality of the flow paths (3) are disposed adjacent to a heat source (5) in a direction of fluid oscillation, and the flow paths (3) are formed of a plurality of flow paths (3) extending in multiple directions. More specifically, this aspect is a combination of the second, third, and fifth aspects.

The invention according to a twenty-fourth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a bounding portion for defining a boundary of at least the adjacent flow paths (3) of the flow paths (3) is bent. The flow paths (3) are formed of a plurality of flow paths (3) extending in multiple directions, and a heat reservoir (7) for accumulating heat is disposed between a heat source (5) and the flow path (3) having a fluid therein for absorbing heat from the heat source (5). More specifically, this aspect is a combination of the second, fourth and fifth aspects.

The invention according to the twenty-fifth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a plurality of the flow paths (3) are disposed adjacent to a heat source (5) in a direction of fluid oscillation. The flow paths (3) are formed of a plurality of flow paths (3) extending in multiple directions, and a heat reservoir (7) for accumulating heat is disposed between the heat source (5) and the flow path (3) having a fluid therein for absorbing heat from the heat source (5). More specifically, this aspect is a combination of the third, fourth and fifth aspects.

The invention according to the twenty-sixth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a bounding portion for defining a boundary of at least the adjacent flow paths (3) of the flow paths (3) is bent. A plurality of the flow paths (3) are disposed adjacent to a heat source (5) in a direction of fluid oscillation.

A heat reservoir (7) for accumulating heat is disposed between the heat source (5) and the flow path (3) having a fluid therein for absorbing heat from the heat source (5), and oscillatory displacement is imparted to a fluid of the fluids in the flow paths (3), the fluid being located near the heat source (5), such that the fluid is directed toward the heat source (5). More specifically, this invention is a combination of the invention according to the first, second, third and fourth aspects.

The invention according to the twenty-seventh aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region.

Furthermore, the apparatus of the twenty-seventh aspect is characterized in that a bounding portion for defining a boundary of at least the adjacent flow paths (3) of the flow paths (3) is bent. A plurality of the flow paths (3) disposed adjacent to a heat source (5) in a direction of fluid oscillation extends in multiple directions, and oscillatory displacement is imparted to a fluid of the fluids in the flow paths (3). The fluid is located near the heat source (5), such that the fluid is directed toward the heat source (5). More specifically, this aspect is a combination of the first, second, third, and fifth aspects.

The invention according to a twenty-eighth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a bounding portion for defining a boundary of at least the adjacent flow paths (3) of the flow paths (3) is bent. A heat reservoir (7) for accumulating heat is disposed between a heat source (5) and the flow path (3) having a fluid therein for absorbing heat from the heat source (5). The flow paths (3) are formed of a plurality of flow paths (3) extending in multiple directions, and oscillatory displacement is imparted to a fluid of the fluids in the flow paths (3). The fluid is located near the heat source (5), such that the fluid is directed toward the heat source (5). More specifically, this aspect is a combination of the first, second, fourth, and fifth aspects.

The invention according to the twenty-ninth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a plurality of the flow paths (3) are disposed adjacent to a heat source (5) in a direction of fluid oscillation. A heat reservoir (7) for accumulating heat is disposed between the heat source (5) and the flow path (3) having a fluid therein for absorbing heat from the heat source (5). The flow paths (3) are formed of a plurality of flow paths (3) extending in multiple directions, and oscillatory displacement is imparted to a fluid of the fluids in the flow paths (3). The fluid being located near the heat source (5), such that the fluid is directed toward the heat source (5). More specifically, this aspect is a combination of the first, third, fourth, and fifth aspects.

The invention according to a thirtieth aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a bounding portion for defining a boundary of at least the adjacent flow paths (3) of the flow paths (3) is bent. A plurality of the flow paths (3) are disposed adjacent to a heat source (5) in a direction of fluid oscillation. A heat reservoir (7) for accumulating heat is disposed between the heat source (5) and the flow path (3) having a fluid therein for absorbing heat from the heat source (5), and the flow paths (3) are formed of a plurality of flow paths (3) extending in multiple directions. More specifically, this aspect is a combination of the second, third, fourth, and fifth aspects.

The invention according to a thirty-first aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a bounding portion for defining a boundary of at least the adjacent flow paths (3) of the flow paths (3) is bent. A plurality of the flow paths (3) are disposed adjacent to a heat source (5) in a direction of fluid oscillation. A heat reservoir (7) for accumulating heat is disposed between the heat source (5) and the flow path (3) having a fluid therein for absorbing heat from the heat source (5). The flow paths (3) are formed of a plurality of flow paths (3) extending in multiple directions, and oscillatory displacement is imparted to a fluid of the fluids in the flow paths (3), the fluid being located near the heat source (5), such that the fluid is directed toward the heat source (5). More specifically, this aspect is a combination of the first, second, third, fourth, and fifth aspects.

The invention according to the thirty-second aspect is characterized in that the bounding portion for defining the boundary of at least the adjacent flow paths (3) of the flow paths (3) is bent in two dimensions.

The invention according to the thirty-third aspect is characterized in that the bounding portion for defining the boundary of at least the adjacent flow paths (3) of the flow paths (3) is bent in three dimensions.

The invention according to the thirty-fourth aspect is characterized in that the heat reservoir (7) is formed of a material having a specific heat greater than or equal to that of a member constituting the flow paths (3).

The invention according to the thirty-fifth aspect is characterized in that the heat reservoir (7) is constructed such that a portion (3c) of members constituting the flow paths (3), the portion (3c) facing the heat source (5), is thicker in thickness than a bounding portion (3b) for defining a boundary of the adjacent flow paths (3).

The invention according to the thirty-sixth aspect is characterized in that the flow paths (3) are stacked in multiple layers in a direction from the heat source (5) toward the flow paths (3). This makes it possible to provide an increased area contributing to heat exchange between adjacent flow paths (3) thereby ensuring an improvement in the heat transport capability while preventing the counter-stream-mode oscillating-flow heat transport apparatus from being increased in size.

The invention according to the thirty-seventh aspect is characterized in that a portion (3d) of members constituting the flow paths (3), other than a bounding portion (3b) for defining a boundary of the adjacent flow paths (3), is formed of a soft material. This allows the counter-stream-mode oscillating-flow heat transport apparatus to be readily bent just like an electric cord, thereby facilitating the implementation of the counter-stream-mode oscillating-flow heat transport apparatus.

The invention according to the thirty-eighth aspect is characterized in that the flow paths (3) are constructed such that material plates are shaped by etching or stamping and stacked in layers in a direction of their thickness.

The invention according to the thirty-ninth aspect is characterized in that the flow paths (3) are constructed by jointing a wavy material plate (3h) having holes formed thereon and plate-shaped material plates (3j) together.

The invention according to the fortieth aspect is characterized in that a movable element to be displaced by an electromagnetic force and a piston for creating fluid oscillations are integrated into an oscillating device (6) for inducing fluid oscillations.

The invention according to a forty-first aspect provides a cooling device for cooling a heat-generating element using the counter-stream-mode oscillating-flow heat transport apparatus according to any one of the first to fortieth aspects. The cooling device is characterized by having a radiating fin (4a) for enhancing heat exchange between the fluid in the flow paths (3) and an external fluid, and in that an inside of the radiation fin (4a) is in communication with the flow paths (3). This makes it possible to provide improved thermal dissipation capability and thus an increased total quantity of heat transport.

The invention according to a forty-second aspect provides a counter-stream-mode oscillating-flow heat transport apparatus for inducing oscillations of counterflow fluids in adjacent flow paths (3) to thereby exchange heat between the adjacent flow paths (3) and transport heat from a hot region to a cold region. The apparatus is characterized in that a plurality of the flow paths (3) are stacked in layers in a crossover direction relative to a plane in contact with a heat source (5).

The stack in multiple layers makes it possible to provide an increased area contributing to heat exchange between adjacent flow paths (3), thereby ensuring an improvement in the heat transport capability, while preventing the counter-stream-mode oscillating-flow heat transport apparatus from increasing in size.

It is yet another object of the present invention to reduce the pressure loss of a heating medium in a heat transport apparatus having flow paths for the heating medium which are formed into microchannels. It is also another object of the invention to reduce the manufacturing cost of the heat transport apparatus incorporating the microchannel.

To achieve the aforementioned objects, the invention according to a forty-third aspect provides a heat transport apparatus, comprising flow paths (103 to 183) for a fluid to flow therethrough, for transporting heat generated by a heat source (200) from a hot region to a cold region via the fluid. The apparatus is characterized in that a microchannel is formed in the flow paths in the vicinity of the heat source, where the flow paths are reduced in size relative to other portions.

As described above, only part of the flow paths of the heat transport apparatus is formed into microchannels, thereby making it possible to reduce the manufacturing cost of the heat transport apparatus. Additionally, upon forming part of the flow paths into microchannels, flow paths disposed in the vicinity of a heat source having high heat fluxes can be formed into microchannels, thereby releasing heat effectively from the heat source. Since only part of the flow paths is formed into microchannels, it is also possible to prevent an increase in pressure loss and thereby save power of a drive means for driving the fluid. The "vicinity of the heat source" in which the flow paths are formed into microchannels means a location and a portion having a size corresponding to the heat source in the heat transport apparatus, also including those locations and portions having sizes slightly larger or slightly smaller than the heat source.

The invention according to a forty-fourth aspect has a tube-shaped aluminum member having a plurality of through-holes formed parallel to each other, the through-holes constituting the flow paths. The use of such an inexpensive aluminum member makes it possible to manufacture the heat transport members at a low cost.

The invention according to a forty-fifth aspect is characterized in that the microchannel is formed by applying an external force to and thereby compressing the flow paths in the vicinity of the heat source. This allows the microchannel to be formed at a lower cost than by cutting or the like.

As set forth in the invention according to a forty-sixth aspect, the microchannel can be formed of one or more tubular members or one or more rod-like members disposed in the flow paths in the vicinity of the heat source. On the other hand, as set forth in the invention according to a forty-seventh aspect, the microchannel can be formed of a metal with ends in cavity communication with each other in a flow direction of the fluid, the metal being disposed in the flow paths in the vicinity of the heat source. This also allows the microchannel to be formed at lower costs than by cutting or the like. Furthermore, as set forth in the invention according to a forty-eighth aspect, the metal with the cavity can be formed of a foamed metal, a sintered metal, or a metal formed by thermal spraying.

The invention according to a forty-ninth aspect is characterized in that the flow of the fluid is a reciprocating flow with a predetermined cycle and a predetermined amplitude. The use of such an oscillating flow makes it readily possible to make a wide range of adjustments to the heat transport performance by controlling the frequency and amplitude of the fluid.

The present invention according to a fiftieth aspect provides a counter-stream-mode oscillating-flow heat transport apparatus for inducing oscillations of counterflow fluids in adjacent flow paths (60) to thereby exchange heat between the adjacent flow paths (60) and transport heat from a hot side (region) to a cold side (region). The apparatus has a multi-hole tube (41) having a plurality of holes (46) formed to penetrate longitudinally from one end to the other end, first plates (42, 43) coupled to longitudinal ends of the multi-hole tube (41) and having through-holes (47) formed to allow adjacent holes (46) to communicate with each other, and second plates (44, 45) coupled to the first plates (42, 43) to block the through-holes (47). In this apparatus, the multi-hole tube (41) and the first and second plates (42 to 45) constitute the flow paths (60).

This arrangement allows the flow paths (60) to be easily formed, thereby making it possible to reduce the manufacturing cost of the counter-stream-mode oscillating-flow heat transport apparatus.

The invention according to fifty-first aspect is characterized in that the multi-hole tube (41) is fabricated by an extrusion process or by a drawing process. The invention according to fifty-second aspect is characterized in that the first plates (42, 43) are formed into a predetermined shape by pressing.

The invention according to a fifty-third aspect is characterized in that the multi-hole tube (41) and the first and second plates (42 to 45) are joined together by brazing. The invention according to a fifty-fourth aspect is characterized in that the first plates (42, 43) are a clad material having a surface coated with a filler metal. The invention according to a fifty-fifth aspect is characterized in that the multi-hole tube (41) and the first and second plates (42 to 45) are made of an aluminum alloy.

The invention according to fifty-sixth aspect is characterized in that a second multi-hole tube (48) having a different pitch between the adjacent holes (46) is coupled to the multi-hole tube (41). The invention according to fifty-seventh aspect is characterized in that the second multi-hole tube (48) is coupled to the multi-hole tube (41) via a clad material having both front and rear surfaces coated with a filler metal. The invention according to a fifty-eighth aspect is characterized in that a heat-generating element is disposed on a surface of the second multi-hole tube (48).

Incidentally, the parenthesized numerals accompanying the foregoing individual means correspond with numerals in the embodiments to be described later. Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 10A is a partially cutout perspective view showing a counter-stream-mode oscillating-flow heat transport apparatus according to a fourth embodiment of the present invention;

FIG. 10B is a view showing a counter-stream-mode oscillating-flow heat transport apparatus according to a fourth embodiment of the present invention;

FIG. 34A is a view of the configuration of a heat transport apparatus according to a nineteenth embodiment;

FIG. 34B is a cross-sectional view of the configuration of a heat transport apparatus taken at line XXXIVB-XXXIVB of FIG. 34A according to the nineteenth embodiment;

FIG. 34C is a cross-sectional view of the configuration of a heat transport apparatus taken at line XXXIVC-XXXIVC of FIG. 34A according to the nineteenth embodiment;

FIG. 35A is a plan view of the configuration of a heat transport apparatus according to a twentieth embodiment;

FIG. 35B is a side view of the heat transport apparatus of FIG. 35A;

FIG. 35C is a cross-sectional view taken along line XXXVC-XXXVC of FIG. 35A;

FIG. 35D is a cross-sectional view taken along line XXXVD-XXXVD of FIG. 35A;

FIG. 36A is a cross-sectional view of the configuration of a heat receiver portion showing the structure before compression according to a modified example of the twentieth embodiment;

FIG. 36B is a cross-sectional view of the configuration of a heat receiver portion showing the structure after compression according to a modified example of the twentieth embodiment;

FIG. 37A is a plan view of the configuration of a heat transport apparatus according to a twenty-first embodiment;

FIG. 37B is a side view of the configuration of a heat transport apparatus according to a twenty-first embodiment;

FIG. 37C is a cross-sectional view taken along line XXXVIIC-XXXVIIC of FIG. 37B;

FIG. 38A is an enlarged view of the flow paths of FIG. 37C;

FIG. 38B is an enlarged view of a modified example of the flow paths of FIG. 38A;

DETAILED DESCRIPTION OF THE PREFERRED EMBODIMENTS

The following description of the preferred embodiments is merely exemplary in nature and is in no way intended to limit the invention, its application, or uses.

First Embodiment

Figure 1:
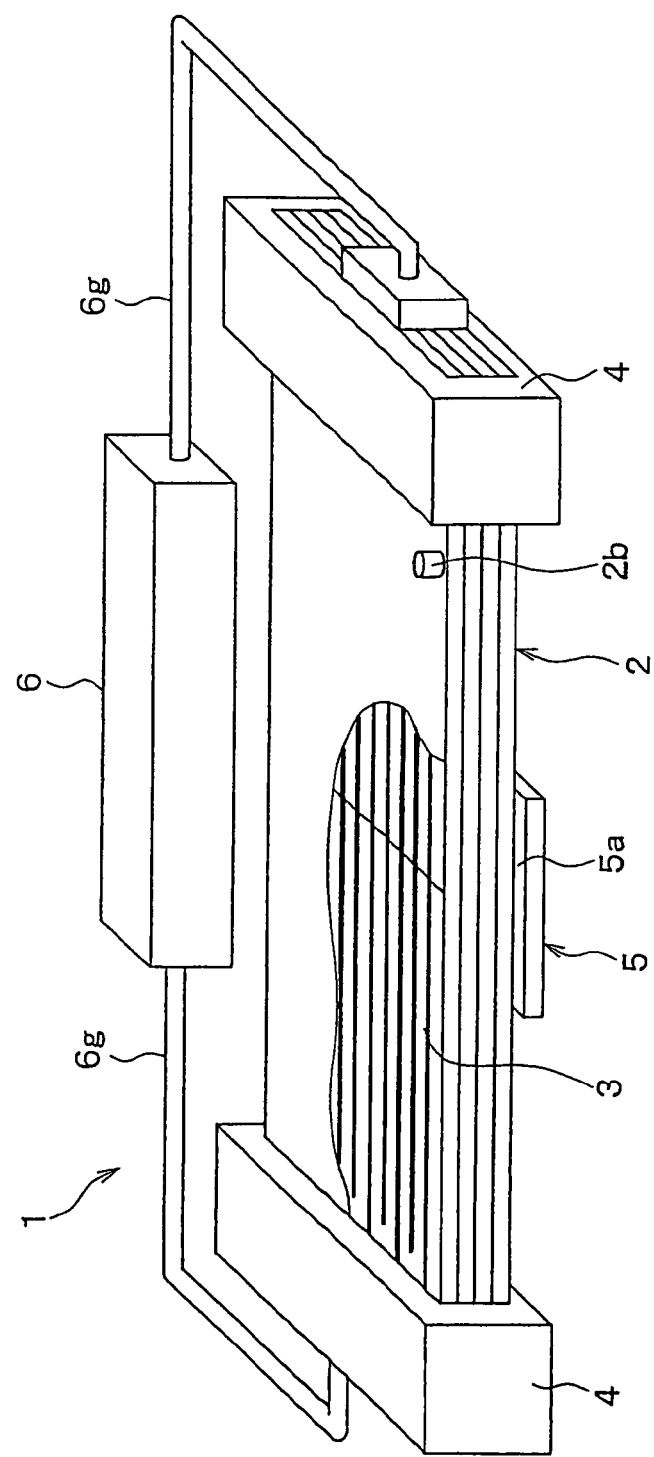
FIG. 1 is a partially cutout perspective view showing a counter-stream-mode oscillating-flow heat transport apparatus according to a first embodiment of the present invention.
Figure 5:
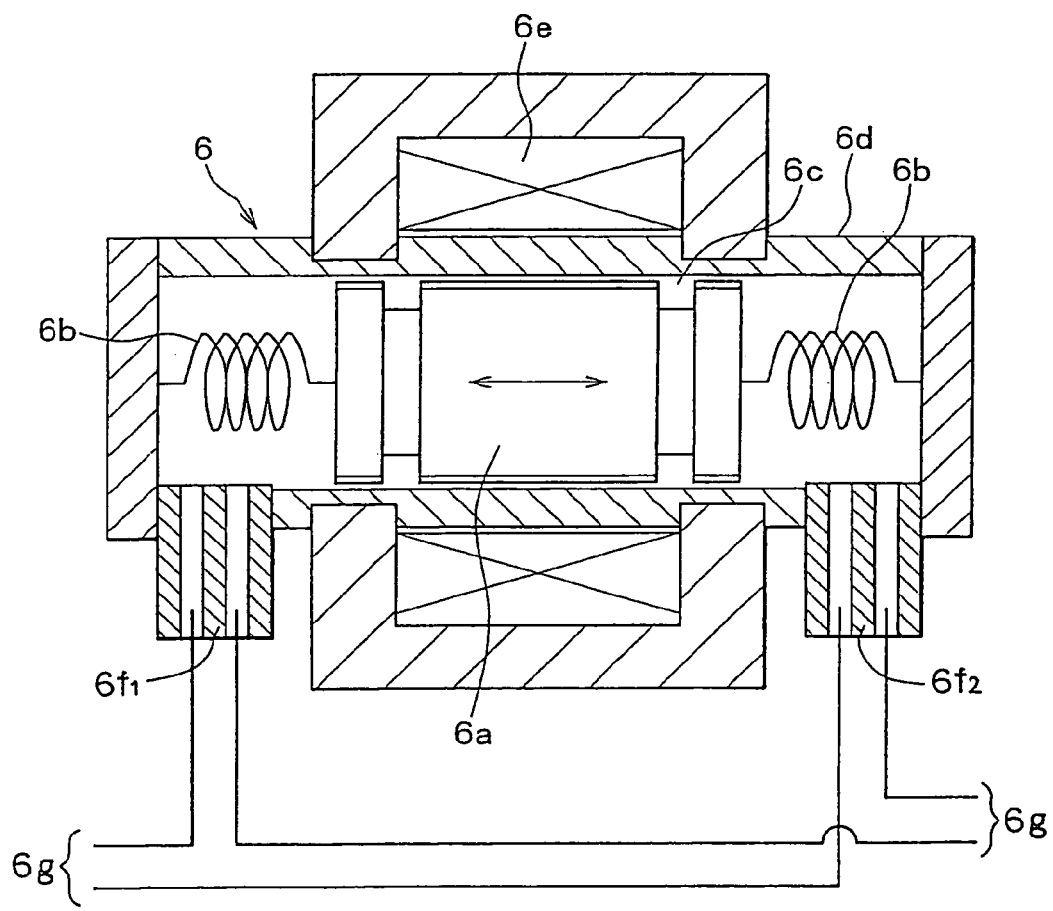
FIG. 5 is a cross-sectional view showing an oscillating device according to the first embodiment of the present invention.
Figure 6A:
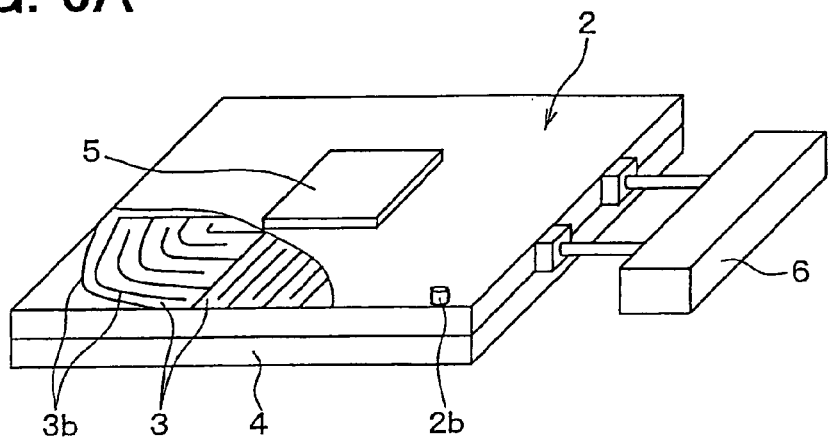
FIG. 6A is a partially cutout, perspective view showing a counter-stream-mode oscillating-flow heat transport apparatus according to a second embodiment of the present invention.
Figure 6B:
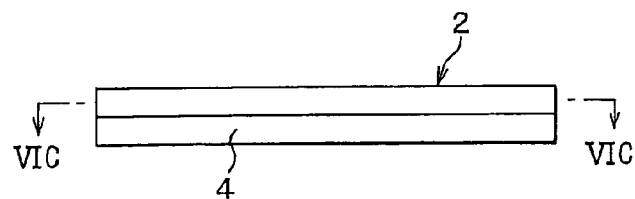
FIG. 6B is a side view showing a counter-stream-mode oscillating-flow heat transport apparatus according to the second embodiment of the present invention.
Figure 6C:
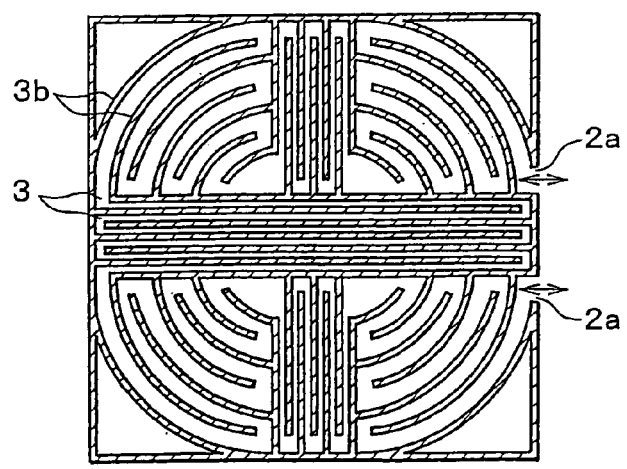
FIG. 6C is a cross-sectional view taken along line VIC-VIC of FIG. 6B showing a counter-stream-mode oscillating-flow heat transport apparatus according to the second embodiment of the present invention.
Figure 7:
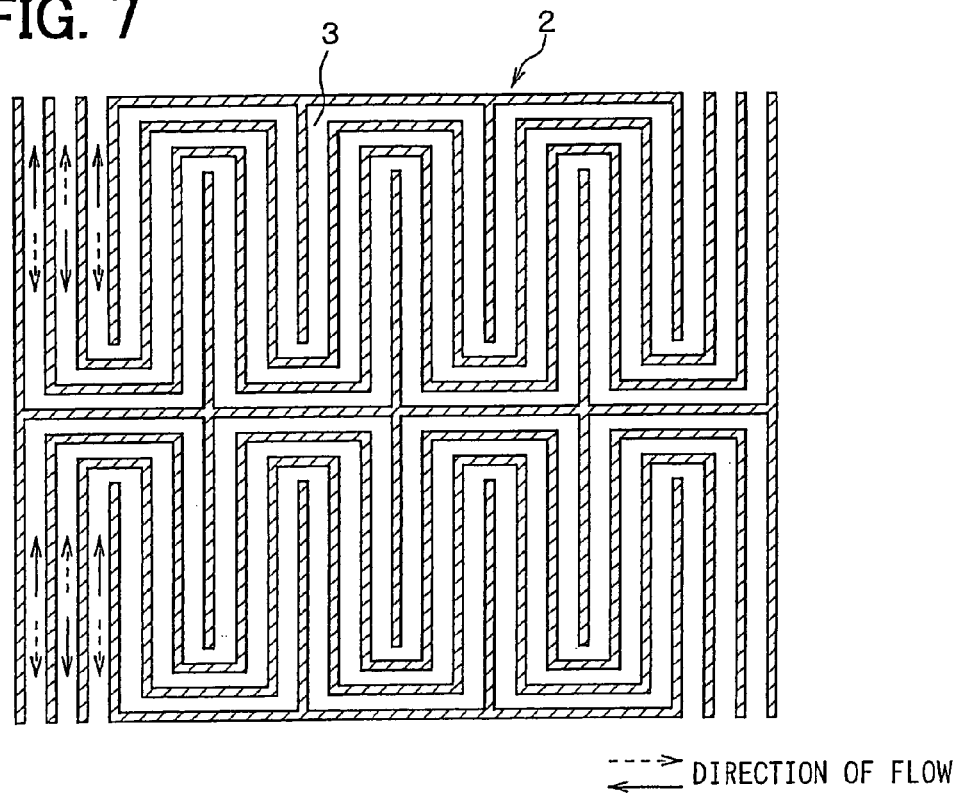
FIG. 7 is a view showing the counter-stream-mode oscillating-flow heat transport apparatus according to the second embodiment of the present invention.
Figure 8:
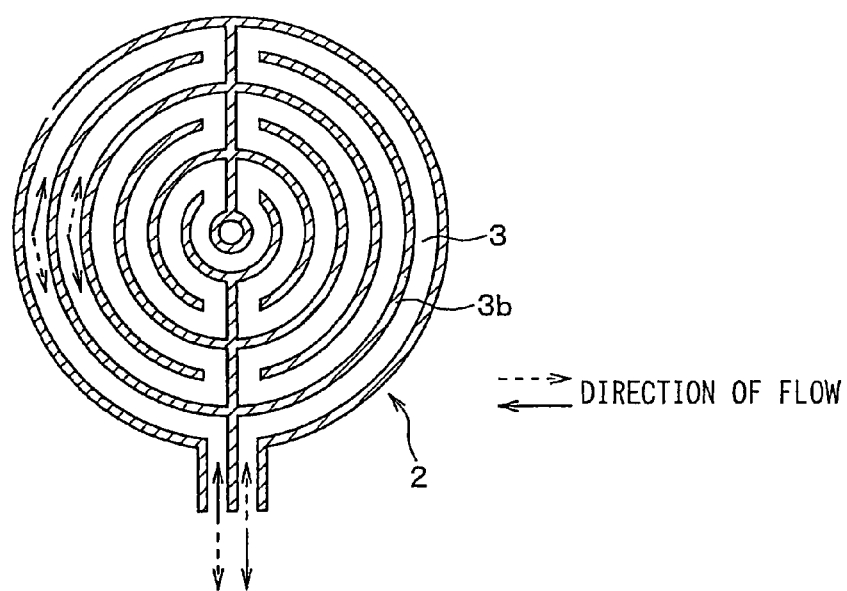
FIG. 8 is a view showing the counter-stream-mode oscillating-flow heat transport apparatus according to the second embodiment of the present invention.

In this embodiment, the present invention is applied to a cooling device for electronic components. FIG. 1 is a partially cutout, perspective view showing the outer appearance of a counter-stream-mode oscillating-flow heat transport apparatus 1 according to this embodiment. FIGS. 2A to 4 are cross-sectional views showing the main portion of the counter-stream-mode oscillating-flow heat transport apparatus 1. FIG. 5 is a schematic view showing an oscillating device 6.

In FIG. 1, a heat transport device assembly 2 formed generally in the shape of a swath or strip of plate has serpentine flow paths 3 occupied by a fluid, and is provided at both longitudinal ends thereof with heat-radiating portions 4 to be cooled by cooling water, while incorporating, generally at the longitudinal center thereof, a heat-generating element 5 or a heat source that is to be cooled. In this embodiment, the heat-generating element 5 is intended to represent electronic components such as integrated circuits of a computer. The configuration of the heat transport device assembly 2 will be described later.

This embodiment employs water as the fluid in the flow paths 3. However, a type of water that is mixed with an additive to reduce the viscosity thereof may also be utilized. The fluid is injected through an inlet 2b with the pressure in the flow paths 3 being reduced by a vacuum pump or the like.

The oscillating device 6 acts as pump means for inducing oscillations in the fluid in the heat transport device assembly 2, and as shown in FIG. 5, is adapted to induce oscillations in the fluid by reciprocating a plunger 6a into which are integrated a movable element to be displaced by an electromagnetic force and a piston for creating oscillations in the fluid.

Springs 6b serve as resilient means for producing a resilient force to bring the plunger 6a, having been displaced by an electromagnetic force, to its original position. A thin-film coating 6c (of thickness about 0.1 mm in this embodiment), which covers the plunger 6a and is made of resin, is responsible for a bearing function for making the plunger 6a slidable within a casing 6d and a sealing function for preventing the fluid from flowing through a gap between the plunger 6a and the casing 6d. An excitation coil 6e establishes a magnetic field.

As shown in FIG. 5, outlet ports 6f1 and 6f2 of the oscillating device 6 are connected to inlet ports 2a (see FIGS. 3 and 4) of the heat transport device assembly 2 via conduits 6g. The interior of the outlet ports 6f1 and 6f2 are divided into two channels.

Now, the heat transport device assembly 2 will be described. The heat transport device assembly 2 has a plurality of serpentine flow paths 3 formed therein, which are constructed first by forming serpentine grooves by etching on metal plates such as copper or aluminum which have a high thermal conductivity. The plates are then bonded together by brazing or by thermal compression in the direction of their thickness to form a stack of the plates with the grooves formed thereon.

Figure 2A:
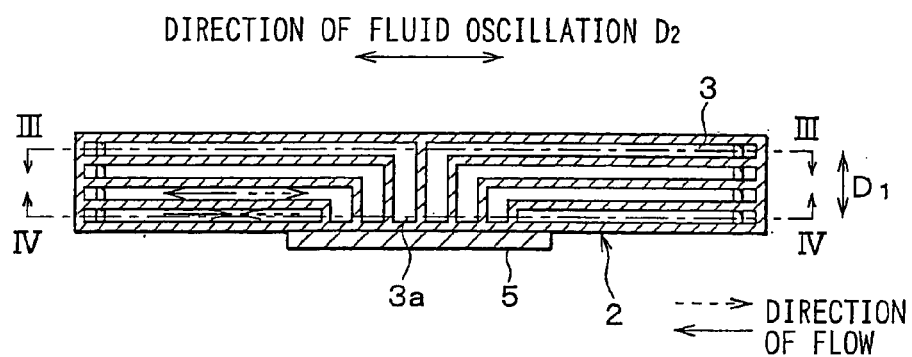
FIG. 2A is a cross-sectional view showing the main portion of the counter-stream-mode oscillating-flow heat transport apparatus according to the first embodiment of the present invention.
Figure 2B:
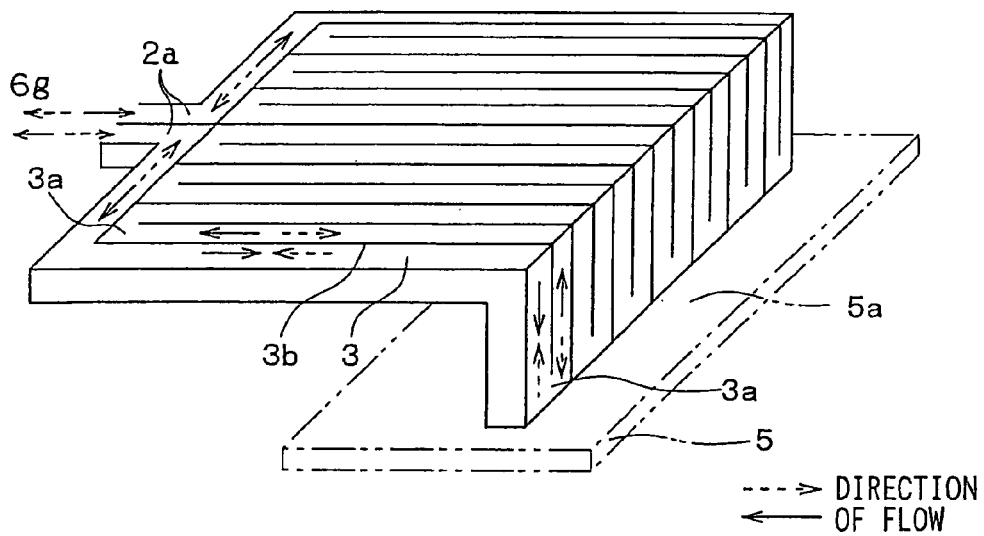
FIG. 2B is a perspective view showing the main portion of the counter-stream-mode oscillating-flow heat transport apparatus according to the first embodiment of the present invention.
Figure 3:
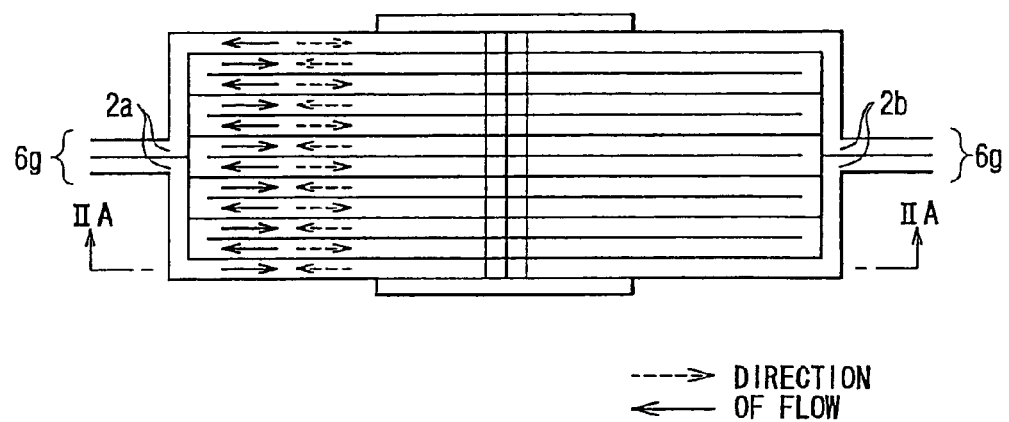
FIG. 3 is a cross-sectional view of line III-III of FIG. 2A showing the main portion of the counter-stream-mode oscillating-flow heat transport apparatus according to the first embodiment of the present invention.
Figure 4:
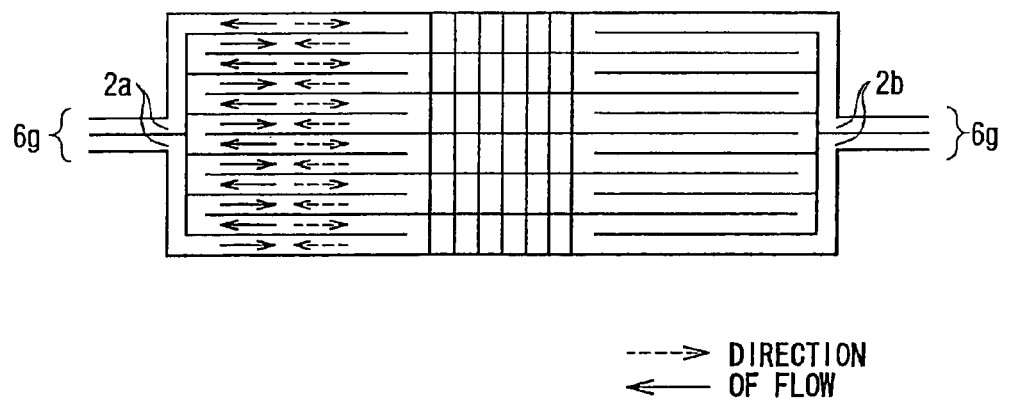
FIG. 4 is a cross-sectional view of line IV-IV of FIG. 2A showing the main portion of the counter-stream-mode oscillating-flow heat transport apparatus according to the first embodiment of the present invention.

As shown in FIG. 2B, in this embodiment, the flow paths 3 adjacent to the heat-generating element 5 are disposed perpendicular to the plate-shaped heat-generating element 5 to produce oscillatory displacements in the fluid, of the fluids in the flow paths 3, located near the heat-generating element 5, such that the fluid is directed toward the heat-generating element 5. Additionally, turning portions 3a of the serpentine flow paths 3 are disposed so as to face the heat-generating element 5.

Furthermore, as shown in FIGS. 2A to 4 (particularly, FIG. 2B), the flow paths 3 are in three dimensions with two different directions parallel to a plate surface 5a of the heat-generating element 5 and the third direction perpendicular to the plate surface 5a. The flow paths 3 are stacked in multiple layers in the direction from the heat-generating element 5 to the flow paths 3 (in the vertical direction D1 shown in FIG. 2A). Additionally, as shown in FIG. 2A, a plurality of flow paths 3 (eight in this embodiment) are disposed adjacent to the heat-generating element 5 in the direction of fluid oscillation.

In the foregoing, the "direction of fluid oscillation" refers to the direction D2 (see FIG. 2A) leading macroscopically from the heat-generating element 5 to the heat-radiating portions 4. However, since the flow paths 3 are shown in three dimensions (loosely in the shape of a crank) in this embodiment, the directions of fluid oscillation are different microscopically depending on the position of the flow paths 3.

Now, the operation or effects of this embodiment will be described. The oscillating device 6 is operated to create oscillations of counterflow fluids in adjacent flow paths 3 with a bounding portion 3b for defining the boundary thereof interposed therebetween. This allows a high-temperature fluid phase and a low-temperature fluid phase to periodically oppose each other with the bounding portion 3b interposed therebetween, thus causing heat to be transferred in a "frog jump" kind of way as described above. Accordingly, "hot heat" of the heat-generating element 5 is transferred from the heat-generating element 5 to the heat-radiating portions 4 in the direction orthogonal to the longitudinal direction of the heat transport device assembly 2, whereas "cold heat" generated in the heat-radiating portions 4 is transferred from the heat-radiating portions 4 to the heat-generating element 5 in the direction orthogonal to the longitudinal direction of the heat transport device assembly 2.

At this time, oscillatory displacement is imparted to a fluid located near the heat-generating element 5 as the fluid is directed toward the heat-generating element 5. This induces an oscillating movement and turbulence in the fluid at particular portions of the flow paths 3 corresponding to the heat-generating element 5. This causes a low-temperature fluid to intermittently collide against the portion corresponding to the heat-generating element 5, thereby providing an increased coefficient of heat transfer between the heat-generating element 5 and the fluid.

In contrast to this, the prior art counter-stream-mode oscillating-flow heat transport apparatus imparts oscillatory displacements to the fluid parallel to the plate surface of a heat-generating element at the portion of the flow paths corresponding to the heat-generating element, thus inducing almost no turbulence and providing a lower coefficient of heat transfer than this embodiment. This embodiment thus allows a larger quantity of heat to be collected from the heat-generating element 5 in a shorter period of time than, say, a prior art counter-stream-mode oscillating-flow heat transport apparatus, thereby making it possible to provide improved heat transport capability than the prior art counter-stream-mode oscillating-flow heat transport apparatus.

Furthermore, the turning portions 3a of the serpentine flow paths 3 are disposed to face the heat-generating element 5. This ensures the imparting of the oscillating movement and turbulence to the fluid at a portion of the flow paths 3 corresponding to the heat-generating element 5, thereby ensuring an improvement in heat transport capability.

Still furthermore, the flow paths 3 are crank-shaped, and the flow paths 3 are stacked in multiple layers in the direction from the heat-generating element 5 toward the flow paths 3. This makes it possible to increase the area that contributes to heat exchange between adjacent flow paths 3 while preventing the heat transport device assembly 2 from being increased in size, thereby ensuring an improvement in heat transport capability.

The fluid exchanges heat with the heat-generating element 5 at a portion of the flow paths 3 corresponding to the heat-generating element 5, naturally in a manner such that the greater the difference in temperature between the fluid and the heat-generating element 5, the more the linear increase in the quantity of heat exchange becomes. In contrast to this, the quantity of heat exchange is not linearly increased as the opposing area between the heat-generating element 5 and the fluid increases, but becomes saturated against the increase in the opposing area.

That is, a maximum temperature difference $\Delta T$ is provided between the fluid and the heat-generating element 5 at an end of the heat-generating element 5. However, since the quantity of heat exchange is reduced exponentially in response to an increase in the opposing area between the heat-generating element 5 and the fluid, an increase in the quantity of heat exchange through the opposing area between the heat-generating element 5 and the fluid will become saturated.

Here, the prior art counter-stream-mode oscillating-flow heat transport apparatus employs one flow path 3 adjacent to the heat-generating element 5 in the direction of fluid oscillation, whereas the counter-stream-mode oscillating-flow heat transport apparatus according to this embodiment employs a plurality of flow paths 3 adjacent to the heat-generating element 5 in the direction of fluid oscillation. Suppose that both the prior art counter-stream-mode oscillating-flow heat transport apparatus and the counter-stream-mode oscillating-flow heat transport apparatus 1 according to this embodiment have the same total opposing area. In this case, the counter-stream-mode oscillating-flow heat transport apparatus according to this embodiment has a smaller opposing area per piece than the prior art counter-stream-mode oscillating-flow heat transport apparatus.

However, as described above, the increase in the quantity of heat exchange through the opposing area is saturated. Thus, even for a reduced opposing area per piece, the arrangement with a plurality of flow paths 3 adjacent to the heat-generating element 5 can provide, as a whole, an increased quantity of heat to be absorbed from the heat-generating element 5. Accordingly, it is possible to ensure improved heat transport capability while preventing the heat transport device assembly 2 from increasing in size.

Second Embodiment

In the fourteenth embodiment, the flow paths 3 are shown in three dimensions that extend in a plurality of directions in those dimensions. However, as shown in FIGS. 6A to 8, this embodiment employs flow paths 3 in two dimensions that extend in a plurality of directions of those two dimensions.

Third Embodiment

Figure 9:
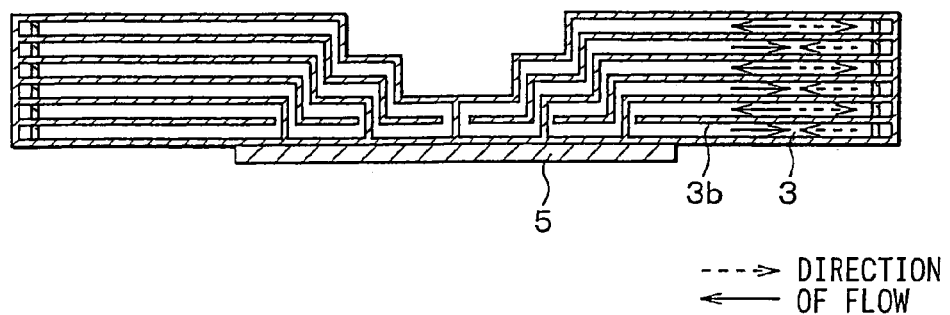
FIG. 9 is a view showing a counter-stream-mode oscillating-flow heat transport apparatus according to a third embodiment of the present invention.

In the fourteenth embodiment, to employ a plurality of flow paths 3 adjacent to the heat-generating element 5 in the direction of fluid oscillation, the flow paths 3 adjacent to the heat-generating element 5 are disposed generally perpendicular to the plate surface 5a of the heat-generating element 5, as shown in FIG. 2A. However, as shown in FIG. 9, this embodiment allows the flow paths 3 adjacent to the heat-generating element 5 to be disposed generally parallel to the plate surface 5a of the heat-generating element 5.

Fourth Embodiment

In the aforementioned embodiments, the heat-generating element 5 is in direct contact with the heat transport device assembly 2 or a member constituting the flow paths 3. However, as shown in FIG. 10, this embodiment is provided with a heat reservoir 7, for accumulating heat therein, between the heat-generating element 5 and the flow paths 3 in which the fluid is present that absorbs heat from the heat-generating element 5. In this embodiment, a member having a specific heat equal to or greater than that of the member constituting the flow paths 3 is interposed between the heat transport device assembly 2 and the heat-generating element 5, thereby forming the heat reservoir 7.

Now, the operation or effects of this embodiment will be described. For electronic components such as integrated circuits in a computer, their macroscopic, or overall, average temperature needs to be kept within a predetermined temperature range, and a sudden variation in temperature in a short period of time may lead to significant degradation in durability, that is, service life.

On the other hand, to collect heat from the heat-generating element 5 with a high degree of efficiency, a large temperature difference $\Delta T$ is required between the heat-generating element 5 and the fluid. However, oscillatory displacements in the fluid at a portion of the flow paths 3 corresponding to the heat-generating element 5 lead to a sudden variation in the temperature difference $\Delta T$ in a short period of time. Therefore, a relatively low frequency of oscillation needs to be provided for the fluid in order to prevent a sudden variation in the temperature of the heat-generating element 5 in a short period of time. However, it is difficult for this means to ensure an improved heat transport capability.

In contrast to this, this embodiment is provided with the heat reservoir 7 between the heat-generating element 5 and the flow paths 3 in which the fluid is present that absorbs heat from the heat-generating element 5. Thus, the heat reservoir 7 serves as a buffer for accommodating a change in temperature although the heat transfer from the heat-generating element 5 to the fluid is retarded by the heat reservoir 7, thereby making it possible to provide an increased frequency of oscillation for the fluid.

Accordingly, since the frequency of oscillation of the fluid can be increased, it is possible to increase the total quantity of heat transport even when the heat transfer from the heat-generating element 5 to the fluid is retarded by the heat reservoir 7. It is also possible to increase the total quantity of heat transport while reducing the variation in temperature of the heat-generating element 5.

Fifth Embodiment

Figure 11:
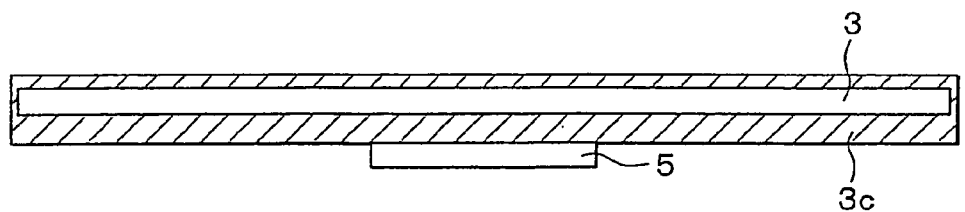
FIG. 11 is a view showing a counter-stream-mode oscillating-flow heat transport apparatus according to a fifth embodiment of the present invention.

As shown in FIG. 11, this embodiment is a modified example of the fourth embodiment and provides a portion 3*c* among the members constituting the flow paths 3, the portion 3*c* facing the heat-generating element 5 and being thicker than the bounding portion 3*b*, to form the heat reservoir 7.

Sixth Embodiment

Figure 12A:
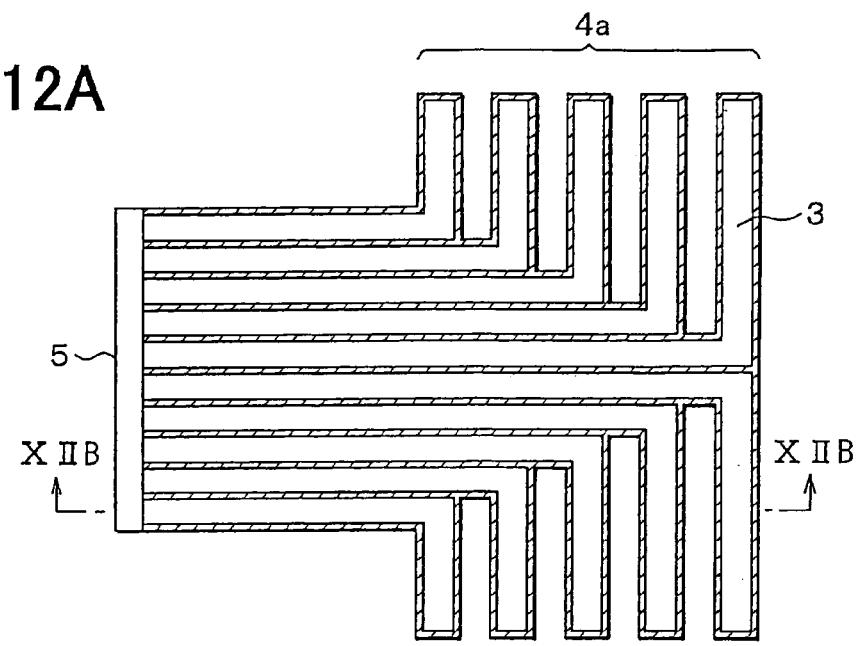
FIG. 12A is a cross-sectional view showing a counter-stream-mode oscillating-flow heat transport apparatus according to a sixth embodiment of the present invention.
Figure 12B:
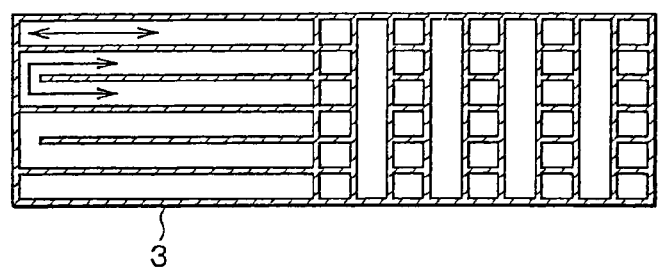
FIG. 12B is a cross-sectional view taken along the line XIIB-XIIB of FIG. 12A showing a counter-stream-mode oscillating-flow heat transport apparatus according to a sixth embodiment of the present invention.
Figure 13:
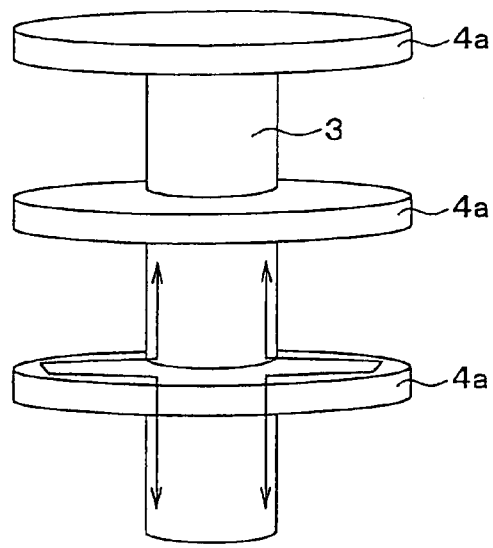
FIG. 13 is a view showing the counter-stream-mode oscillating-flow heat transport apparatus according to the sixth embodiment of the present invention.

In the fourteenth embodiment, principally, only the heat-radiating portions 4 dissipate the heat from the heat-generating element 5. However, as shown in FIGS. 12A, 12B, and 13, this embodiment is provided with a radiating fin 4*a* for enhancing heat exchange between the fluid in the flow paths 3 and an external fluid (air in this embodiment). This embodiment is configured such that the flow paths 3 are in communication with an inside of the radiating fin 4*a* allowing the flow paths 3 themselves to serve as a radiating fin. This makes it possible to provide improved thermal dissipation and thus an increased total heat transport quantity.

FIGS. 12A and 12B show an example in which the radiating fin 4*a* is provided at an end of the heat transport device assembly 2 in its longitudinal direction. FIG. 13 shows an example in which the radiating fin 4*a* is provided on the way of the flow paths 3.

Seventh Embodiment

Figure 14A:
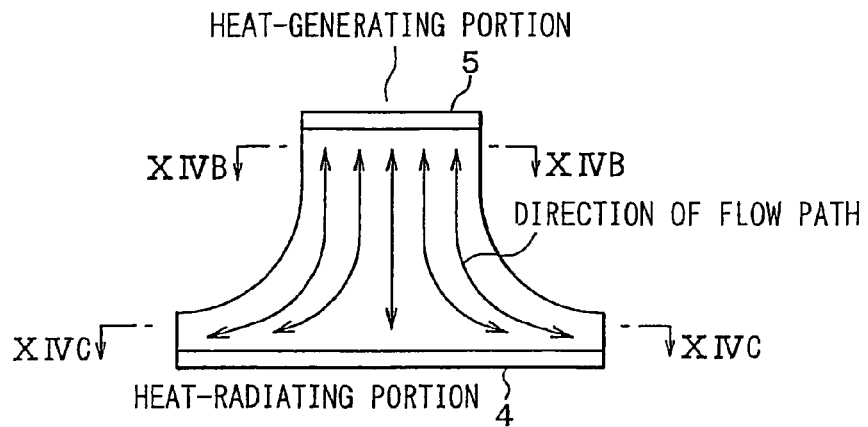
FIG. 14A is a side view showing a counter-stream-mode oscillating-flow heat transport apparatus according to a seventh embodiment of the present invention.

In the fourteenth embodiment, to impart oscillatory displacements to the fluid in a manner such that the fluid located near the heat-generating element 5 be directed toward the heat-generating element 5, a portion of the flow paths 3 adjacent to the heat-generating element 5 is disposed generally perpendicular to the plate surface 5*a* of the heat-generating element 5 with the other portions being disposed generally parallel to the plate surface 5*a* of the heat-generating element 5. As shown in FIGS. 14A through 15, this embodiment is configured such that the other portions are also disposed generally perpendicular to the plate surface 5*a* of the heat-generating element 5 in addition to the portion of the flow paths 3 adjacent to the heat-generating element 5.

Figure 14B:
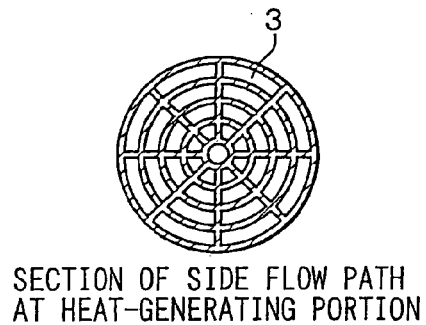
FIG. 14B is a cross-sectional view taken along the line XIVB-XIVB of FIG. 14A showing a heat-generating portion of a counter-stream-mode oscillating-flow heat transport apparatus according to a seventh embodiment of the present invention.
Figure 14C:
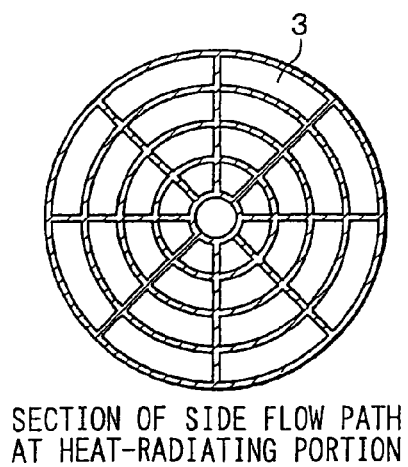
FIG. 14C is a cross-sectional view taken along the line XIVC-XIVC of FIG. 14A showing a heat-radiating portion of a counter-stream-mode oscillating-flow heat transport apparatus according to a seventh embodiment of the present invention.
Figure 15:
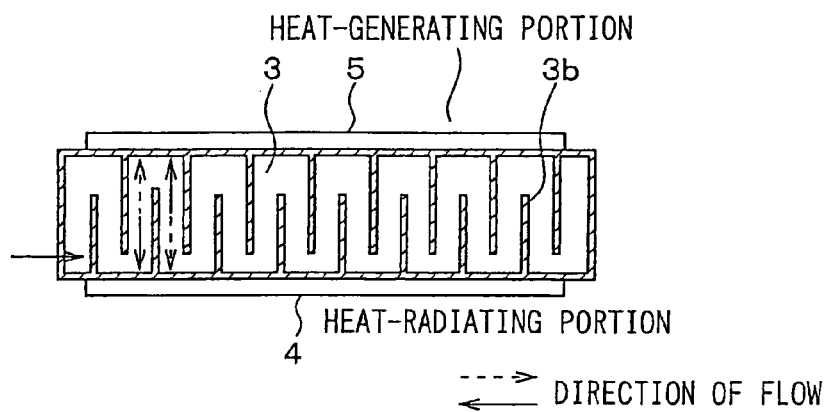
FIG. 15 is a view showing the counter-stream-mode oscillating-flow heat transport apparatus according to the seventh embodiment of the present invention.

In FIGS. 14A to 14C, since the heat-radiating portion 4 is larger than the portion to which the heat-generating element 5 is attached, an increased angle of inclination is provided relative to the normal direction of the plate surface 5*a* in the vicinity of the heat-radiating portions 4 along the flow paths 3.

Furthermore, according to FIGS. 14A through 15, since the heat-generating element 5 and the heat-radiating portion 4 are disposed in the direction in which the fluid transports heat, it is still possible to satisfactorily transport heat from the heat-generating element 5 to the heat-radiating portion 4 even with a short distance between the heat-generating element 5 and the heat-radiating portion 4.

Eighth Embodiment

Figures 16A, 16B:
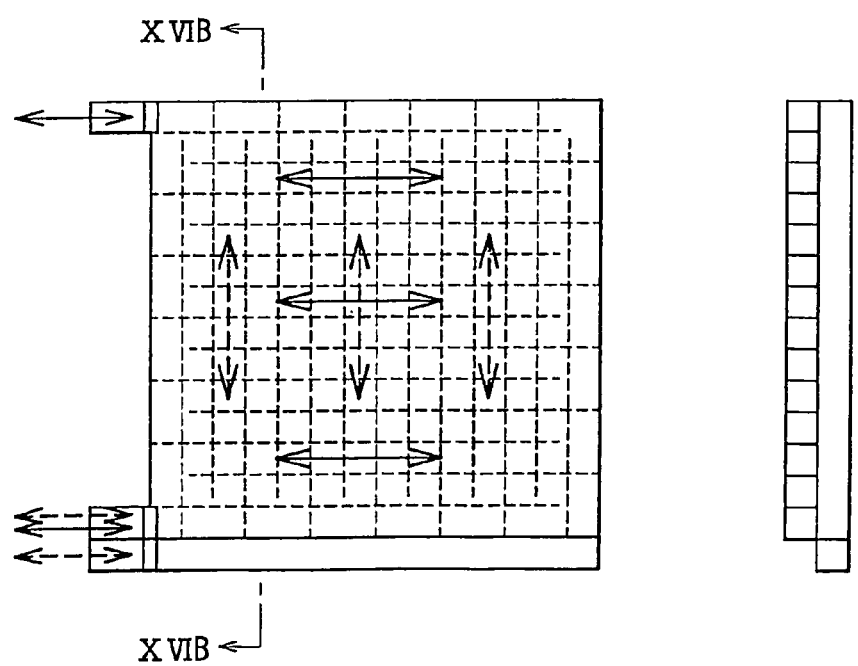
FIG. 16A shows a counter-stream-mode oscillating-flow heat transport apparatus according to an eighth embodiment of the present invention.
FIG. 16B is a cross-sectional view taken at line XVIB-XVIB of FIG. 16A of a counter-stream-mode oscillating-flow heat transport apparatus according to the eighth embodiment of the present invention.

In the aforementioned embodiments, heat is exchanged between adjacent flow paths 3 on a plane parallel to the plate surface 5*a*. However, as shown in FIGS. 16A and 16B, this embodiment allows heat to be exchanged between adjacent flow paths 3 on a plane orthogonal to the plate surface 5*a*, thereby providing an increased area contributing to heat exchange.

Furthermore, in the aforementioned embodiments, the fluids in adjacent flow paths 3 are oscillated in the counterflow directions parallel to each other on a plane parallel to the plate surface 5*a*. However, in this embodiment, the fluids in adjacent flow paths 3 are oscillated in crosswise directions on a plane orthogonal to the plate surface 5*a*.

The fluids in adjacent flow paths 3 on a plane orthogonal to the plate surface 5*a* may be oscillated for heat exchange in the crosswise directions, while the fluids in the adjacent flow paths 3 on a plane parallel to the plate surface 5*a* may be oscillated in the counterflow directions parallel to each other, thereby allowing heat to be exchanged in the two directions.

Figure 23A:
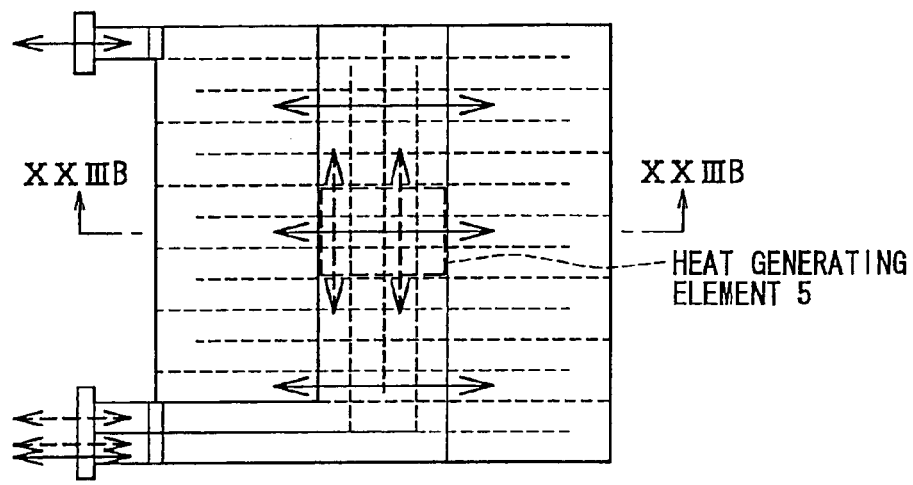
FIG. 23A shows a counter-stream-mode oscillating-flow heat transport apparatus.
Figure 23B:
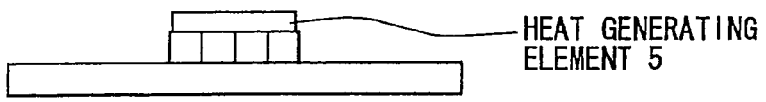
FIG. 23B is a cross-sectional view taken at line XXIIIB-XXIIIB of FIG. 23A.

Furthermore, as shown in FIGS. 23A and 23B, the flow paths in contact with the heat-generating element 5 are formed only in the vicinity of the heat-generating element 5 (e.g., over the width thereof), so that the fluids in adjacent flow paths are oscillated in the counterflow directions parallel to each other (allowing heat to be diffused in one direction). Additionally, fluids in flow paths disposed parallel to the aforementioned flow paths and orthogonal thereto are oscillated in the counterflow directions orthogonal to the direction in which heat is allowed to diffuse (causing the heat to diffuse). Since the counterflow paths are disposed only in the vicinity of the heat-generating element, the paths can be shortened. Therefore, reduced power for the operation is required.

Ninth Embodiment

Figure 17:
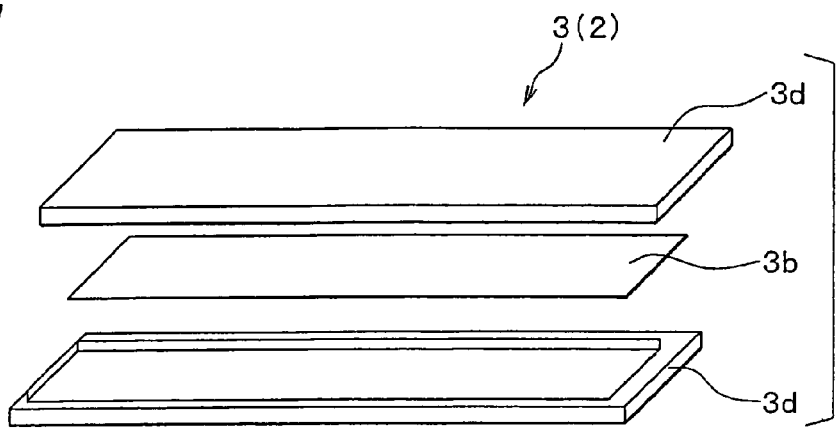
FIG. 17 is a view showing a counter-stream-mode oscillating-flow heat transport apparatus according to a ninth embodiment of the present invention.

In the aforementioned embodiments, the heat transport device assembly 2 is nearly a perfect rigid body. However, as shown in FIG. 17, this embodiment is provided with a bounding portion 3*b*, among the members constituting the flow paths 3, formed of a metal such as an annealed copper having good thermal conductivity. Additionally, portions 3*d*, separate from the bounding portion 3*b*, are formed of a soft material such as resin. This resin portion 3*d* can be recessed to accept the metal thin plate 3*b*. This construction and these materials allows the heat transport device assembly 2 to be readily bent just like an electric cord, thereby facilitating the implementation of the counter-stream-mode oscillating-flow heat transport apparatus.

Tenth Embodiment

Figure 18A:
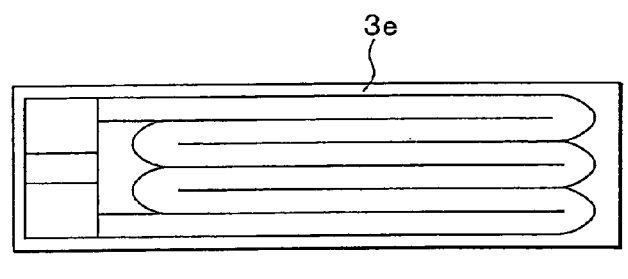
FIG. 18A shows a counter-stream-mode oscillating-flow heat transport apparatus according to a tenth embodiment of the present invention.
Figure 18B:
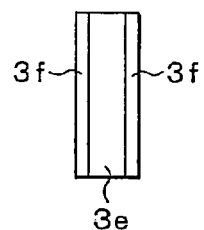
FIG. 18B shows a counter-stream-mode oscillating-flow heat transport apparatus according to the tenth embodiment of the present invention.

As shown in FIGS. 18A and 18B, this embodiment provides a heat transport device assembly 2 having a plurality of serpentine flow paths 3 therein which are formed by stamping grooves or holes on a material plate 3*e* corresponding to the flow paths 3 and then by brazing or thermally compressing a stack of alternate material plates 3*e* and material plates 3*f* having neither grooves nor holes.

Eleventh Embodiment

Figure 19A:
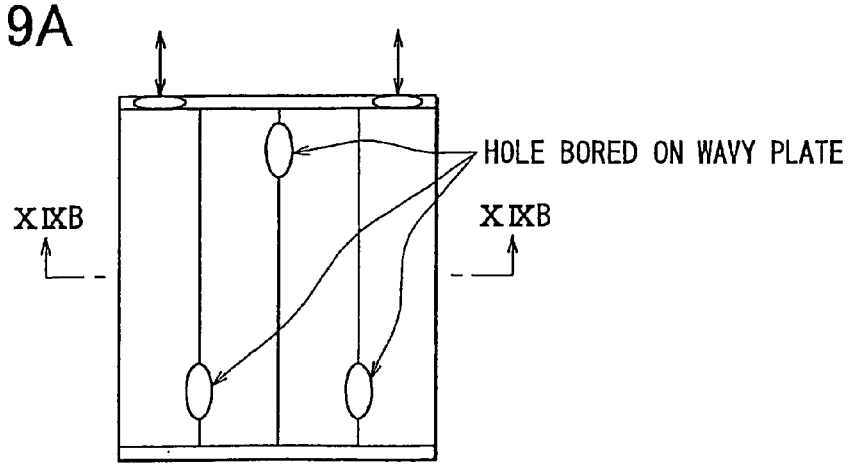
FIG. 19A shows a counter-stream-mode oscillating-flow heat transport apparatus according to an eleventh embodiment of the present invention.
Figure 19B:
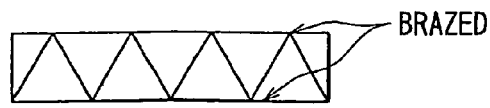
FIG. 19B is a cross-sectional view showing a counter-stream-mode oscillating-flow heat transport apparatus according to the eleventh embodiment of the present invention.

As shown in FIGS. 19A and 19B, this embodiment provides a heat transport device assembly 2 having a plurality of serpentine flow paths 3 therein which are formed by brazing or thermally compressing a wavy material plate 3*h*, on which holes 3*g* are bored, and plate-shaped material plates 3*j*.

Twelfth Embodiment

Figure 20A:
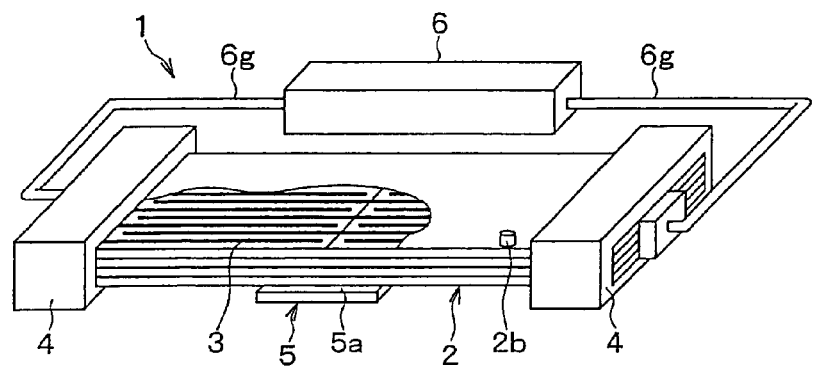
FIG. 20A shows a partially cutout perspective view of a counter-stream-mode oscillating-flow heat transport apparatus according to a twelfth embodiment of the present invention.
Figure 20B:
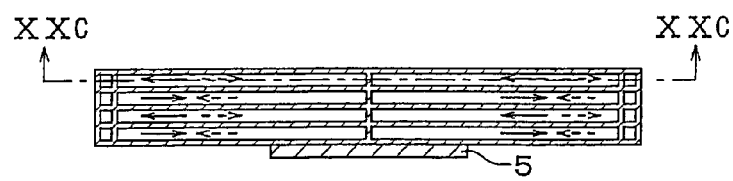
FIG. 20B shows a counter-stream-mode oscillating-flow heat transport apparatus according to the twelfth embodiment of the present invention.
Figure 20C:
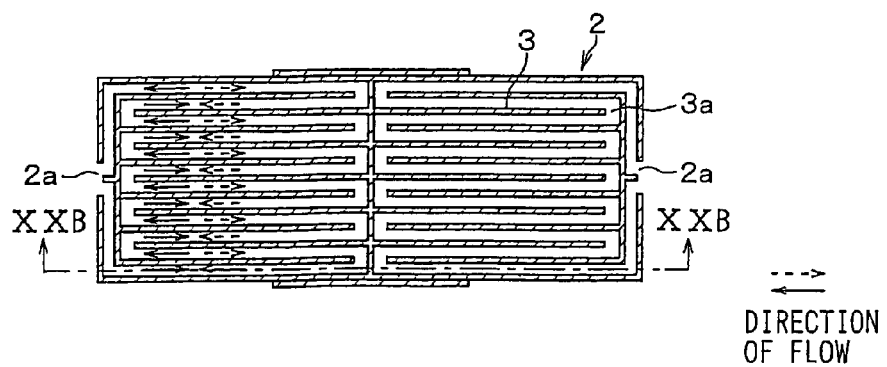
FIG. 20C shows a counter-stream-mode oscillating-flow heat transport apparatus according to the twelfth embodiment of the present invention.

As shown in FIGS. 20A, 20B, and 20C, this embodiment provides flow paths 3 that are stacked in multiple layers in the direction orthogonal to a plane in contact with the heat-generating element 5. While preventing the counter-stream-mode oscillating-flow heat transport apparatus 1 from increasing in size, this embodiment allows the flow paths 3 stacked in multiple layers to provide an increased area contributing to heat exchange between adjacent flow paths 3 as well as to ensure an improvement in heat transport capability.

Thirteenth Embodiment

Figure 21:
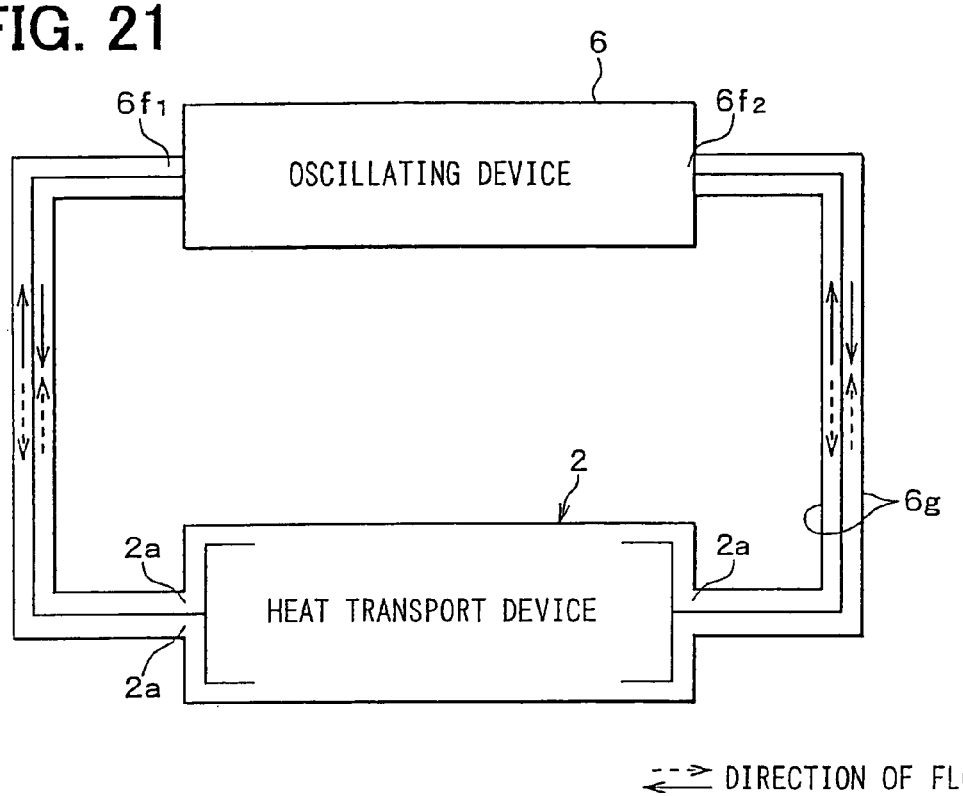
FIG. 21 is a view showing a counter-stream-mode oscillating-flow heat transport apparatus according to a thirteenth embodiment of the present invention.
Figure 22:
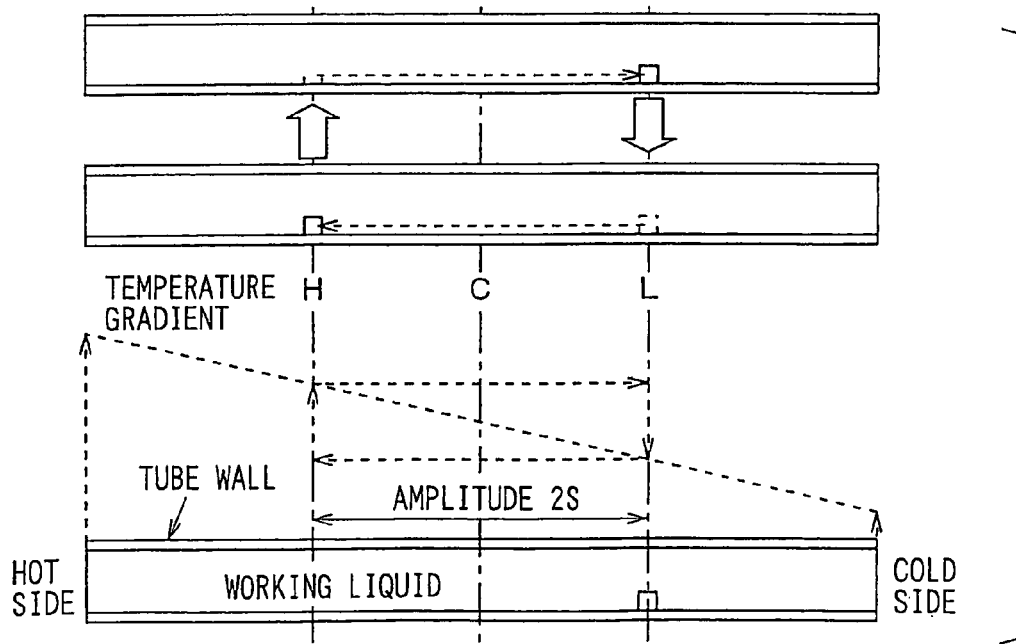
FIG. 22 is an explanatory view showing the operation of a counter-stream-mode oscillating-flow heat transport apparatus.

In the aforementioned embodiments, the heat transport device assembly 2 is connected to the oscillating device 6 via the conduit 6g, the interior of which is divided into two sections. However, as shown in FIG. 21, this embodiment allows the heat transport device assembly 2 and the oscillating device 6 to be connected to each other via two conduits 6g, the interior of which is not divided into two.

Other Embodiments

The aforementioned embodiments provide the plunger 6a that is reciprocated to thereby induce oscillatory movements in the fluid, but the present invention is not limited thereto, and allows the ends of the flow paths 3 to be squeezed or crushed in order to induce oscillatory movements in the fluid. This method allows the sealing mechanism to be eliminated, thereby simplifying the oscillating device 6.

Furthermore, the aforementioned embodiments provide the turning portions 3a to implement the flow paths 3 in a serpentine structure, but the present invention is not limited thereto, and allows each of adjacent flow paths 3 to form a closed loop without fluid communication between the adjacent flow paths 3 via the turning portion 3a. In this case, for example, since it is difficult to provide oscillatory movements in a non-compressive fluid within a closed loop (the flow path 3), air bubbles need to be mixed with the fluid to permit oscillatory movements in the fluid within the flow paths 3.

Fourteenth Embodiment

Now, the present invention will be described below with reference to FIGS. 24 to 27B in accordance with a fourteenth embodiment. In this embodiment, a heat transport apparatus according to the present invention is applied to a cooling device for electronic components.

Figure 24:
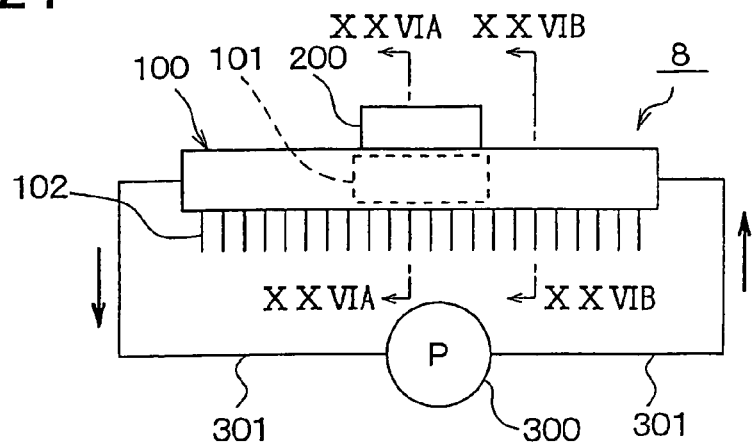
FIG. 24 is a conceptual view showing the overall configuration of a heat transport system according to a fourteenth embodiment.
Figure 25:
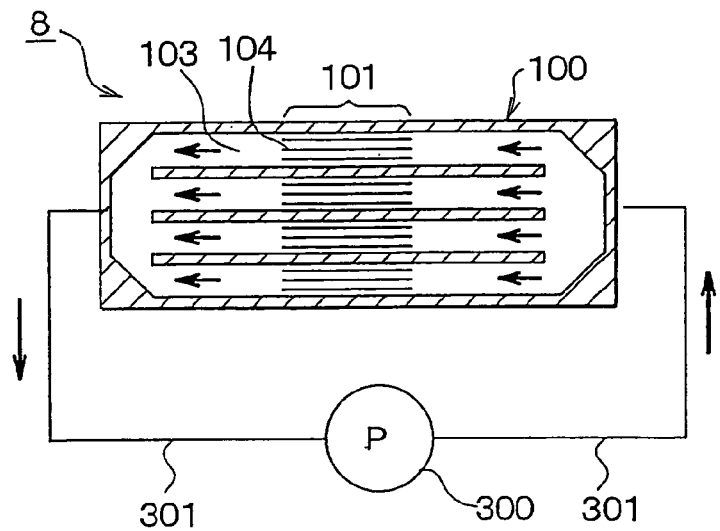
FIG. 25 is a cross-sectional view showing the overall configuration of the heat transport system when viewed from the mount surface of a heat-generating element according to the fourteenth embodiment.

FIG. 24 is a conceptual view illustrating the overall configuration of a heat transport system 8 incorporating a heat transport apparatus 100 according to the fourteenth embodiment. FIG. 25 is a cross-sectional view illustrating the configuration of the heat transport apparatus 100 of FIG. 24 when viewed from the mount surface of a heat-generating element (heat source) 200.

As shown in FIG. 24, the heat transport system 8 includes the heat transport apparatus 100 for releasing heat from the heat-generating element 200 of high heat fluxes and a circulation pump 300 for circulating a fluid (heating medium) through the heat transport apparatus 100. Preferably, as the heat-generating element 200, it is possible to employ electronic components, such as power components like amplifiers or IGBTs in telecommunication base stations or CPUs, which generate high temperatures during operation.

In this twenty-fourth embodiment, preferably, as the material of the heat transport apparatus 100, it is possible to employ a metal having a high heat-conductivity such as aluminum or copper. This fourteenth embodiment uses a die-cast aluminum. As the material of the heat transport apparatus 100, it is also possible to use a resin material, in the case of which the heat transport apparatus 100 can be flexibly shaped, thereby improving the ease of its attachment to a portion complicated in shape.

The heat transport apparatus 100 has a heat receiver portion 101 which is in contact with the heat-generating element 200. In the heat transport apparatus 100 according to the twenty-fourth embodiment, a heat-radiating portion (heat radiating fin) 102 is formed on the entire surface opposite to the mount surface of the heat-generating element 200. The heat transport apparatus 100 allows the heat receiver portion 101 to accept heat from the heat-generating element 200 at a high temperature, and then allows the heat-radiating portion 102 to release outwardly the heat received at the heat receiver portion 101. Heat is transferred from the heat receiver portion 101 to the heat-radiating portion 102 via a fluid, generally known as the heating medium. As the fluid, it is possible to use water or LLCs (antifreeze liquids).

At a position corresponding to the heat-generating element 200 in the heat transport apparatus 100, the heat receiver portion 101 for transferring heat from the heat-generating element 200 to the fluid is designed to be equal in size to the heat-generating element 200. The heat receiver portion 101 may be slightly greater than or slightly smaller than the heat-generating element 200, but is preferably greater than the heat-generating element 200 in order to transfer heat efficiently.

As shown in FIG. 25, a plurality of flow paths 103 are provided that are parallel to each other within the heat transport apparatus 100. In this fourteenth embodiment, the flow paths 103 are about 200 mm in length, the entire length of the heat-generating element 200 being about 30 mm. The flow paths 103 of the heat transport apparatus 100 are approximately several millimeters (1 to 2 mm in this embodiment) in width (the length orthogonal to the direction of fluid flow). The circulation pump (means for driving the fluid) 300 of the fourteenth embodiment is designed to circulate the fluid in one direction, allowing the fluid to flow in the same direction (from right to left in FIG. 25) through all the flow paths 103 of the heat transport apparatus 100.

Figure 26A:
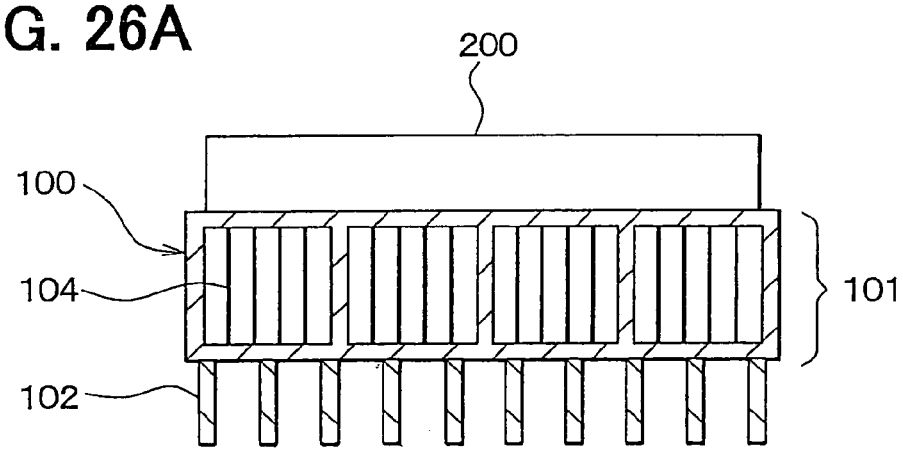
FIG. 26A is a cross-sectional view of the heat transport apparatus taken at line XXVIA-XXVIA of FIG. 24.
Figure 26B:
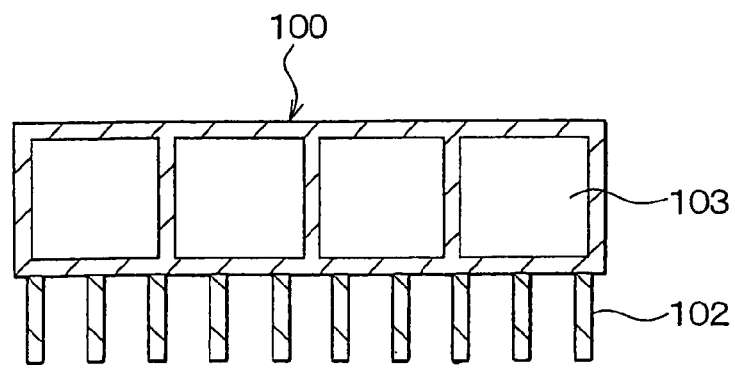
FIG. 26B is a cross-sectional view of the heat transport apparatus taken at line XXVIB-XXVIB of FIG. 24.

FIGS. 26A and 26B are cross-sectional views of the configuration of the heat transport apparatus 100. FIG. 26A is a cross-sectional view taken along the line XXVIA-XXVIA of FIG. 24, and FIG. 26B is a cross-sectional view taken along the line XXVIB-XXVIB of FIG. 24. As shown in FIGS. 26A and 26B, there are provided a plurality of microchannel forming portions 104 in each of the flow paths 103 of the heat receiver portion 101 parallel to the direction of fluid flow. The microchannel forming portions 104 of the fourteenth embodiment are formed in the shape of a thin plate. In the heat receiver portion 101, the microchannel forming portions 104 provide a microstructure to the flow paths 103, thereby allowing microchannels to be formed. The "microchannel" as used herein refers to a flow path having a microstructure less than or equal to 1 mm in width.

The smaller the flow path area, the larger the heat transfer area becomes, while the resulting reduced hydrodynamic diameter (typical diameter) causes the heat transfer coefficient to increase. However, an excessively reduced size of the microstructure causes an increase in pressure loss. Thus, it is preferable to form the microchannel within the range of 0.1 to 0.5 mm in width. The fourteenth embodiment provides microchannels having a width of 0.3 mm in the heat receiver portion 101.

Figure 27A:
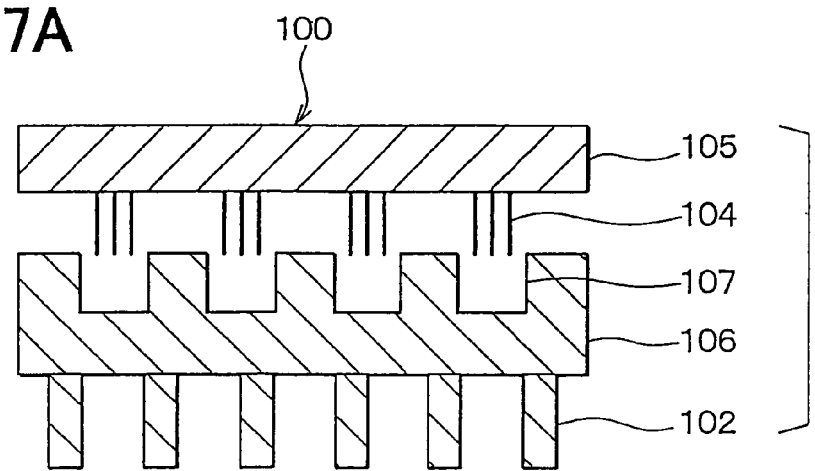
FIG. 27A shows a step of forming microchannels in the heat transport apparatus.
Figure 27B:
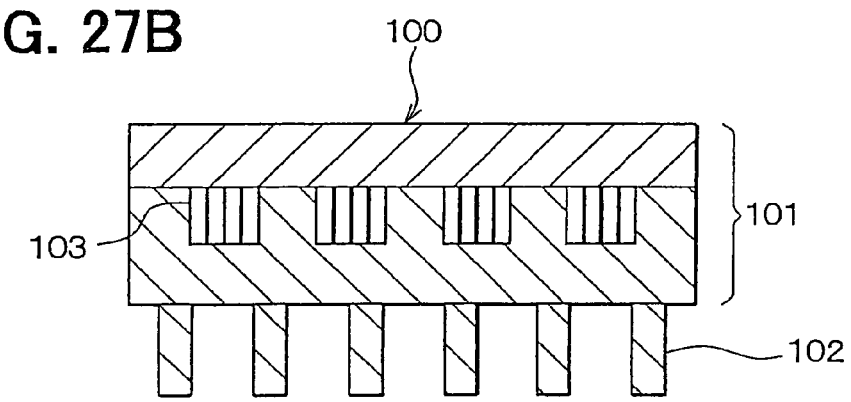
FIG. 27B shows a step of forming microchannels in the heat transport apparatus.

FIGS. 27A and 27B show steps of forming microchannels in the heat transport apparatus 100, FIGS. 27A and 27B being cross-sectional views both similar to FIG. 26A. As shown in FIG. 27A, the heat transport apparatus 100 includes a cover portion 105 and a base portion 106. The cover portion 105 is integrated, at the portions thereof corresponding to the heat receiver portion 101, with the microchannel forming portions 104. The microchannel forming portions 104 of the fourteenth embodiment are formed in the shape of a thin plate. The base portion 106 is formed of a die-cast aluminum on which groove portions 107 are formed to constitute the flow paths 103.

As shown in FIG. 27B, the cover portion 105 is placed onto the base portion 106 so that the microchannel forming portions 104 of the cover portion 105 are fitted into the groove portions 107 of the base portion 106. The portions at which the cover portion 105 is in contact with the groove portions 107 are jointed together by brazing, welding, adhesive bonding or the like. This arrangement allows the microchannel forming portions 104 to provide a microstructure to the flow paths 103 corresponding to the heat receiver portion 101 and thereby form microchannels.

Heat is transferred as follows in the heat transport system having the aforementioned configuration. First, the heat generated in the heat-generating element 200 is transferred to the heat receiver portion 101 in the heat transport apparatus 100. In the heat receiver portion 101, the heat is transferred from the microchannel forming portions 104 to the fluid. The fluid is passed through the flow paths 103 to transfer the heat to the heat-radiating portion 102, where the heat is outwardly released.

As described above, only part of the flow paths 103 of the heat transport apparatus 100 is formed into microchannels, thereby making it possible to reduce the manufacturing costs. Upon forming part of the flow paths 103 into microchannels, the flow paths 103 disposed in the vicinity of the heat-generating element 200 of high heat fluxes can be formed into microchannels, thereby releasing heat effectively from the heat-generating element 200. Since only part of the flow paths 103 is formed into microchannels, it is also possible to prevent an increase in pressure loss and thereby save the power of the circulation pump 300. Furthermore, the die-cast aluminum on which the groove portions 107 are formed is used for the base portion 106, thereby making it possible to reduce manufacturing costs when compared with the case where the grooves are formed by cutting.

Fifteenth Embodiment

Now, the present invention will be described with reference to FIG. 28 in accordance with a fifteenth embodiment. The fifteenth embodiment is different from the fourteenth embodiment in that it has a different heat transport apparatus flow path structure. The following description differentiates this embodiment from the fourteenth embodiment.

Figure 28:
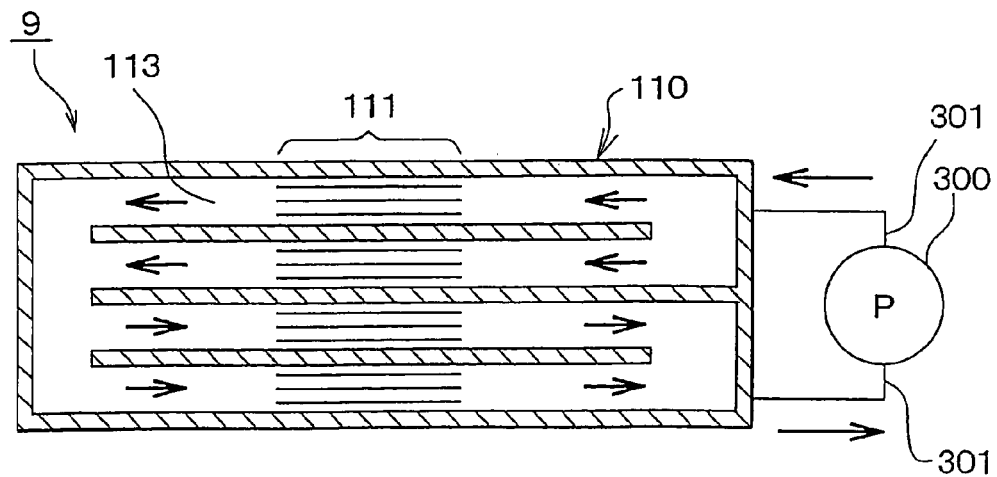
FIG. 28 is a cross-sectional view showing the overall configuration of a heat transport system according to a fifteenth embodiment.

FIG. 28 is a view showing the overall configuration of a heat transport system 9 according to the second embodiment, corresponding to FIG. 25 of the aforementioned fourteenth embodiment. As shown in FIG. 28, a heat transport apparatus 110 according to the fifteenth embodiment is designed such that the fluid makes U-turns to flow therein. In other words, a fluid flowing in from the right end of the heat transport apparatus 110 in FIG. 28 passes from right to left and then makes a U-turn at the left end to flow out of the right end. Such an arrangement can also provide the same effects as those of the aforementioned fourteenth embodiment.

Sixteenth Embodiment

Now, the present invention will be described with reference to FIGS. 29 and 30 in accordance with a sixteenth embodiment. The sixteenth embodiment is different from the fourteenth embodiment in having different configurations of the heat transport apparatus and the pump. The following description differentiates this embodiment from the fourteenth embodiment.

Figure 29:
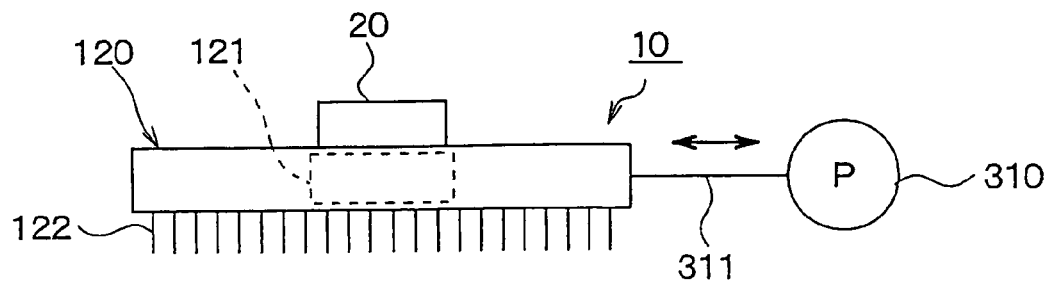
FIG. 29 is a conceptual view showing the overall configuration of a heat transport system according to a sixteenth embodiment.

FIG. 29 is a conceptual view showing the overall configuration of a heat transport system 10 incorporating a heat transport apparatus 120 according to the sixteenth embodiment. FIG. 30 is a cross-sectional view illustrating the configuration of the heat transport apparatus 120 of FIG. 29 when viewed from the mount surface of the heat-generating element 200. FIG. 29 corresponds to FIG. 24, and FIG. 30 corresponds to FIG. 25.

Figure 30:
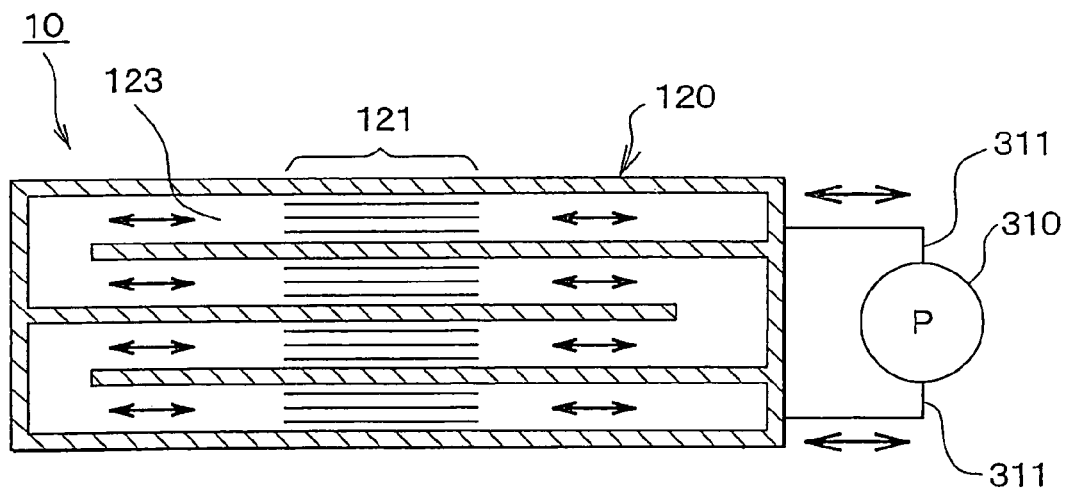
FIG. 30 is a cross-sectional view showing the overall configuration of the heat transport system of the configuration of the heat transport apparatus of FIG. 29 when viewed from the mount surface of a heat-generating element according to the sixteenth embodiment.

As shown in FIGS. 29 and 30, the sixteenth embodiment employs an oscillator pump 310 as a pump for displacing the fluid within the heat transport apparatus 120. For example, the oscillator pump 310 has a piston therein which reciprocates by an electromagnetic force or the like, thereby imparting an oscillatory flow of the fluid in flow paths 123 of the heat transport apparatus 120. With the oscillator pump 310 of the sixteenth embodiment, the cycle and amplitude of the oscillation of the fluid can be set to a given value. Preferably, from the viewpoint of heat transfer performance, the fluid has amplitudes on the order of three times or more the total length of the heat-generating element 200, and in this embodiment, the amplitude of the fluid is set at about 100 mm for the heat-generating element 200 having a total length of about 30 mm.

As shown in FIG. 30, the heat transport apparatus 120 according to the sixteenth embodiment has the flow paths 123 formed in a serpentine shape. More specifically, a plurality of flow paths 123 parallel to each other is provided, with adjacent flow paths being in communication with each other at an end. Adjacent flow paths 123 allow both fluids to be directed in a counterflow relationship.

The heat transport apparatus utilizing such an oscillatory flow allows the oscillation to displace the fluid from a first point, at which a heat receiver portion 121 accepts heat from the heat-generating element 200, to a second point at which heat is transferred to a heat-radiating portion 122. This causes the heat of the heat-generating element 200 to be transferred from the first point to the second point just like a frog jumps from one place to another. Such a heat transfer accompanies the oscillation. Thus, the higher the frequency of oscillation, the larger the number of times of "frog jumps" per unit time becomes, while the larger the amplitude, the greater the distance a frog jump becomes. That is, the displacement of heat accompanying the oscillation increases with an increase in amplitude and cycling of the fluid.

Therefore, increased cycling of the oscillatory flow of the fluid makes it possible to improve heat transport performance, while decreased cycling makes it possible to reduce heat transport performance. Likewise, an increased amplitude of the oscillatory flow of the fluid makes it possible to improve heat transport performance, while a reduced amplitude makes it possible to reduce heat transport performance. The heat transport apparatus 120 employing oscillatory flow controls the frequency and amplitude of the fluid as described above, thereby facilitating the adjustment of the heat transport performance over a wide range.

Seventeen Embodiment

Now, the present invention will be described with reference to FIG. 31 in accordance with a seventeenth embodiment. The seventeenth embodiment is different from the sixteenth embodiment in that it has a different heat transport apparatus configuration. The following description differentiates this embodiment from the third embodiment.

Figure 31:
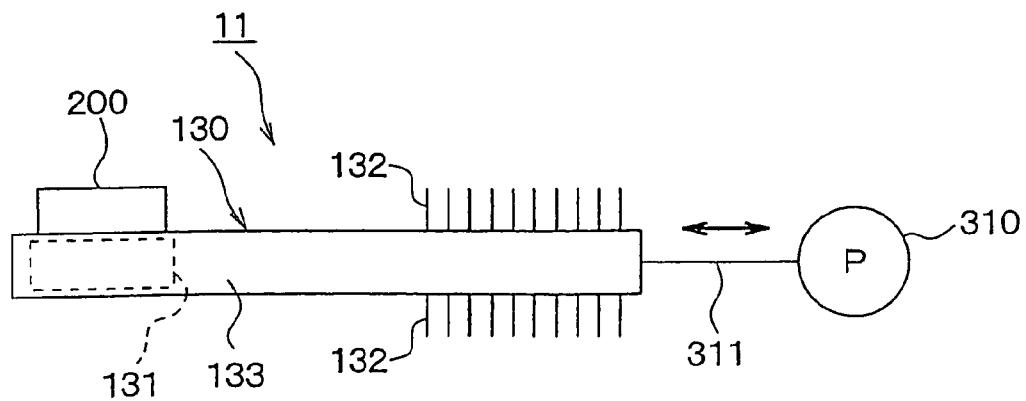
FIG. 31 is a conceptual view showing the overall configuration of a heat transport system according to a seventeenth embodiment.

FIG. 31 is a conceptual view illustrating the overall configuration of a heat transport system 11 incorporating a heat transport apparatus 130 according to the seventeenth embodiment, corresponding to FIG. 29 of the sixteenth embodiment. As shown in FIG. 31, the heat transport apparatus 130 according to the seventeenth embodiment is designed such that a heat receiver portion 131 and a heat-radiating portion 132 are separate. More specifically, the heat receiver portion 131 for accepting heat from the heat-generating element 200 is formed at an end (at the left end of FIG. 31) of the heat transport apparatus 130, while the heat-radiating portion 132 is formed at the other end of the heat transport apparatus 130 (at the right end in FIG. 31). The heat-radiating portion 132 is also formed on a portion on the same side as the mount surface of the heat-generating element 200 in the heat transport apparatus 130 as well as on a portion on the opposite side to the mount surface of the heat-generating element 200. Such an arrangement can also provide the same effects as those of the sixteenth embodiment.

Eighteenth Embodiment

Now, the present invention will be described with reference to FIGS. 32 and 33 in accordance with an eighteenth embodiment. The eighteenth embodiment is different from the fourteenth embodiment in the method for forming microchannels. The following description differentiates this embodiment from the fourteenth embodiment.

Figure 32:
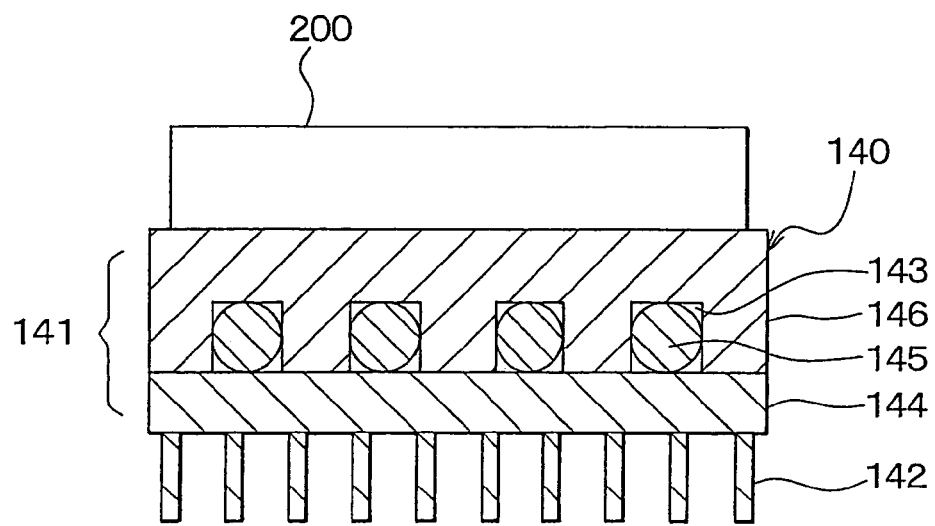
FIG. 32 is a cross-sectional view showing a heat transport apparatus according to an eighteenth embodiment.
Figure 33:
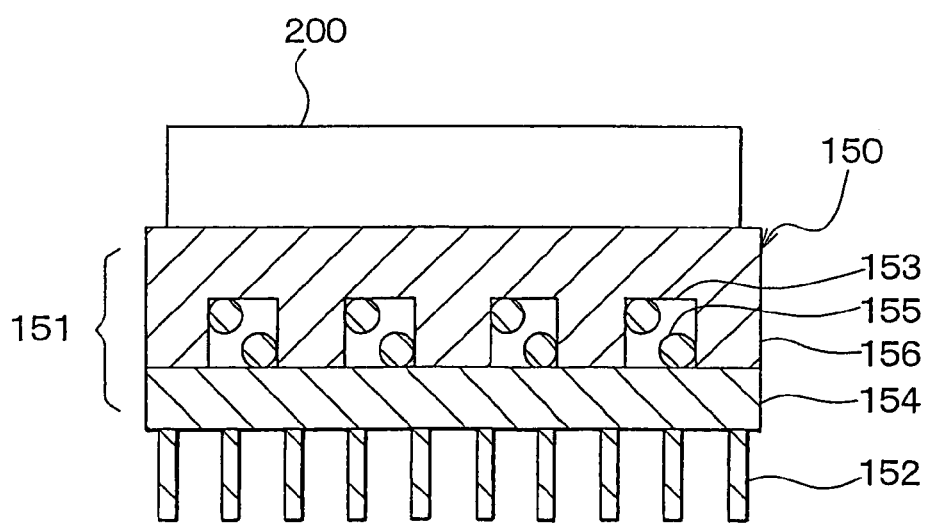
FIG. 33 is a cross-sectional view showing a variation of the heat transport apparatus of the eighteenth embodiment.

FIGS. 32 and 33 are cross-sectional views illustrating heat transport apparatuses 140, 150, corresponding to FIG. 27B of the fourteenth embodiment. As shown in FIGS. 32 and 33, in the eighteenth embodiment, there are provided base portions 146, 156 as sides in contact with the heat-generating element 200, with cover portions 144, 154 disposed opposite to the heat-generating element 200. The cover portions 144, 154 are provided with heat-radiating portions 142, 152.

As shown in FIGS. 32 and 33, microchannel forming portions 145, 155 according to the eighteenth embodiment employ rod-like members (elongated bars) formed separately from the cover portions 144, 154. FIG. 32 shows an example of flow paths 143 each having one rod-like member 145 inserted therein, while FIG. 33 shows another example of flow paths 153 each having two rod-like members 155 inserted therein. The rod-like members 145, 155 are inserted along their longitudinal direction in the direction of fluid flow.

The rod-like members 145, 155 are inserted into the flow paths 143, 153 as described above, thereby making it possible to easily provide a microstructure to the flow paths 143, 153 to form microchannels. Preferably, when the cover portions 144, 154 are secured to the base portions 146, 156, the rod-like members 145, 155 are compressed enough to be slightly crushed, thereby securing the rod-like members 145, 155. This makes it possible to secure the rod-like members 145, 155 to the base portions 146, 156 in thermal contact therewith, thereby providing an improved heat transfer coefficient. It is also possible to obtain the same effects using a hollow tubular member (an elongated tube) in place of the rod-like members 145, 155.

Nineteenth Embodiment

Now, the present invention will be described with reference to FIGS. 34A to 34C in accordance with a nineteenth embodiment. The nineteenth embodiment is different from the fourteenth embodiment in that it has a different heat transport apparatus. The following description differentiates this embodiment from the fourteenth embodiment.

FIGS. 34A, 34B, and 34C are views of the configuration of a heat transport apparatus 160 according to the nineteenth embodiment. FIG. 34A is a plan view showing the heat transport apparatus 160, FIG. 34B is a cross-sectional view taken along the line XXXIVB-XXXIVB of FIG. 34A, and FIG. 34C is a cross-sectional view taken along the line XXXIVC-XXXIVC of FIG. 34A. In FIGS. 34A-34C, the heat-radiating portion is not shown.

The heat transport apparatus 160 according to the nineteenth embodiment employs an extruded tube of aluminum having multiple holes. It is possible to extrude aluminum to form a series of rectangular cross-sectional openings to obtain the extruded tube of aluminum, which can thus be fabricated at a low cost. The extruded tube of aluminum 160 has a plurality of through-holes formed parallel to each other, which constitute flow paths 163 through which a fluid passes. The through-holes have a width on the order of 1 mm.

In the nineteenth embodiment, a heat receiver portion 161 of the heat transport apparatus 160 is compressed in a direction parallel to its width (in the length-wise direction of the page in FIG. 34A), thereby forming the flow paths 163 of the heat receiver portion 161 into microchannels. As described above, an inexpensive extruded tube of aluminum is used as the heat transport apparatus 160 and part of it is compressed to form the flow paths 163 into microchannels, thereby making it possible to provide the heat transport apparatus 160 at a low cost which has the flow paths 163 formed into microchannels.

Twentieth Embodiment

Now, the present invention will be described with reference to FIGS. 35A through 36B in accordance with a twentieth embodiment. The twentieth embodiment is different from the nineteenth embodiment because it has a different configuration of the heat transport apparatus. The following description differentiates this embodiment from the nineteenth embodiment.

FIGS. 35A through 35D are views of the configuration of a heat transport apparatus 170 according to the twentieth embodiment. FIG. 35A is a plan view showing the heat transport apparatus 170, FIG. 35B is a side view showing the heat transport apparatus 170, FIG. 35C is a cross-sectional view taken along the line XXXVC-XXXVC of FIG. 35A, and FIG. 35D is a cross-sectional view taken along the line XXXVD-XXXVD of FIG. 35A. In FIGS. 35A-35D, the heat-radiating portion is not shown. In the twentieth embodiment, a heat receiver portion 171 of the heat transport apparatus (that is, an extruded tube of aluminum) 170 is compressed vertically (in the vertical direction of the page in FIG. 35B), thereby providing a microstructure to the flow paths 173 of the heat receiver portion 171 to form microchannels.

On the other hand, the cross-sectional arrangement of the extruded tube of aluminum may be changed to an example shown in FIGS. 36A and 36B. FIGS. 36A and 36B are cross-sectional views of the configuration of the heat receiver portion 171. FIG. 36A shows the structure before compression, and FIG. 36B shows the structure after compression. Shown in FIG. 36A is an extruded tube of aluminum having a bounding portion for defining the boundary of adjacent flow paths 173, the bounding portion being bent in a "V" shape. The extruded tube of aluminum is then compressed vertically (in the vertical direction of the page in FIG. 36A), thereby making it possible to provide a stable shape after the compression, as shown in FIG. 36B. Such an arrangement can also provide the same effects as those of the nineteenth embodiment.

Twenty-First Embodiment

Now, the present invention will be described with reference to FIGS. 37A through 38B in accordance with a twenty-first embodiment. The twenty-first embodiment is different from the nineteenth embodiment in that it has a different heat transport apparatus configuration. The following description differentiates this embodiment from the nineteenth embodiment.

FIGS. 37A to 37C are views of the configuration of a heat transport apparatus 180 according to the twenty-first embodiment, FIG. 37A is a plan view showing the heat transport apparatus 180, FIG. 37B is a side view showing the heat transport apparatus 180, FIG. 37C is a cross-sectional view taken along the line XXXVIIC-XXXVIIC of FIG. 37A. In FIGS. 37A-37C, the heat-radiating portion is not shown.

In the example shown in FIGS. 37A-37C, a tubular member (an elongated tube) is inserted into a flow path 183 in a heat receiver portion 181 of a heat transport apparatus (extruded tube of aluminum) 180, and thereafter the flow paths 183 in the heat receiver portion 181 are compressed vertically, that is, in the vertical direction of the page in FIG. 37B, and thereby provided with a microstructure and formed into microchannels. The tubular members inserted and compressed thereafter can be secured to the heat transport apparatus 180 in thermal contact therewith, thereby providing an improved heat transfer coefficient.

FIGS. 38A and 38B illustrate enlarged views of the flow path 183 of FIG. 37C, FIG. 38A showing an example of one tubular member inserted into the flow path 183, FIG. 38B showing an example of four tubular members inserted into the flow path 183. In place of the tubular member, a rod-like member may also be used. Such an arrangement can provide the same effects as those of the nineteenth embodiment.

Other Embodiments

In the aforementioned eighteenth and twenty-first embodiments, the tubular member or the rod-like member is inserted into the flow paths of the heat transport apparatus, thereby forming the flow paths into microchannels; however, a hollow metal piece may also be inserted therein in place of the tubular member and the rod-like member. The hollow metal piece would have cavities therein, which are in communication from one end to the other. For example, as the hollow metal piece, it is possible to employ a foamed metal, a sintered metal, or a metal formed by thermal spraying.

For example, to obtain the foamed metal, a gas is blown into a molten metal or a foaming agent is mixed therewith. To form the sintered metal, metal powder is sintered. However, for example, a copper rod-like member having a lower melting point than that of iron may be inserted into iron powder so as to melt the copper during sintering, thereby making it possible to readily form cavities that are in communication from one end to the other. To form a metal by thermal spraying, a molten metal is sprayed to form cavities during the spraying.

Twenty-second Embodiment

Figure 39:
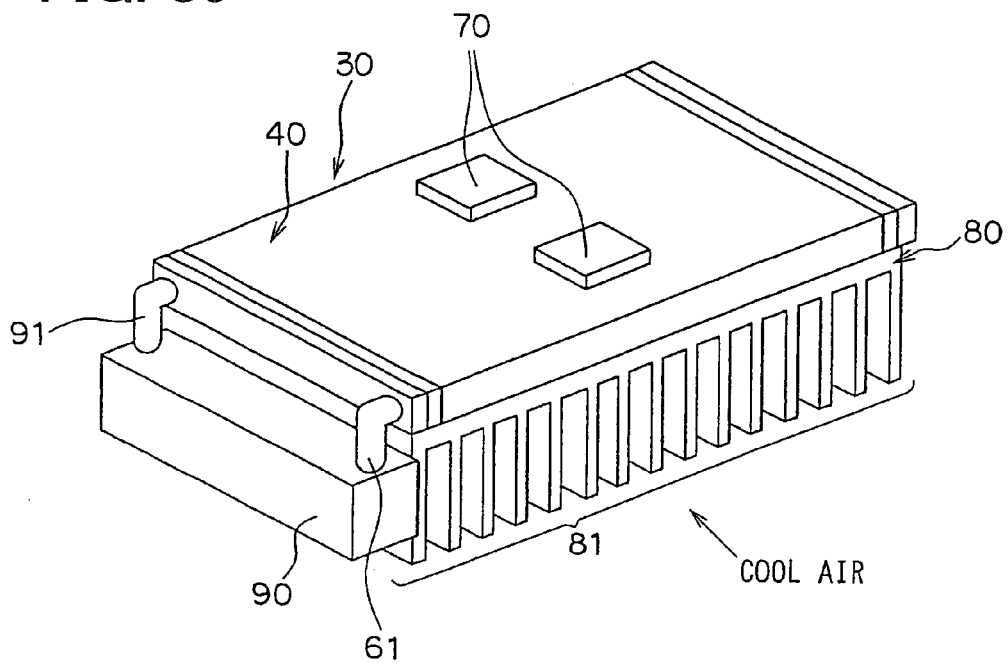
FIG. 39 is a perspective view showing the outer appearance of a counter-stream-mode oscillating-flow heat transport apparatus 30 according to a twenty-second embodiment of the present invention.
Figure 40:
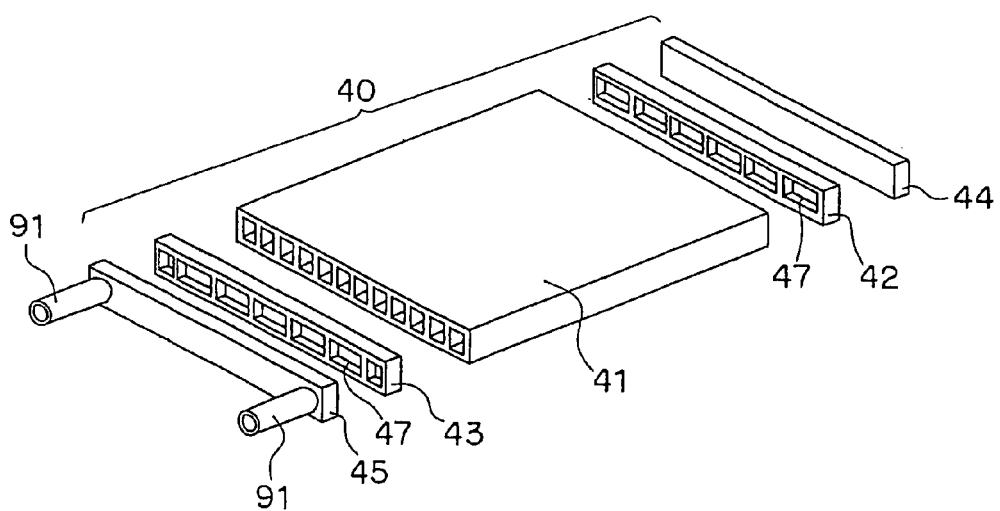
FIG. 40 is a perspective view of the main portion of the counter-stream-mode oscillating-flow heat transport apparatus 30 according to the twenty-second embodiment of the present invention.
Figure 41:
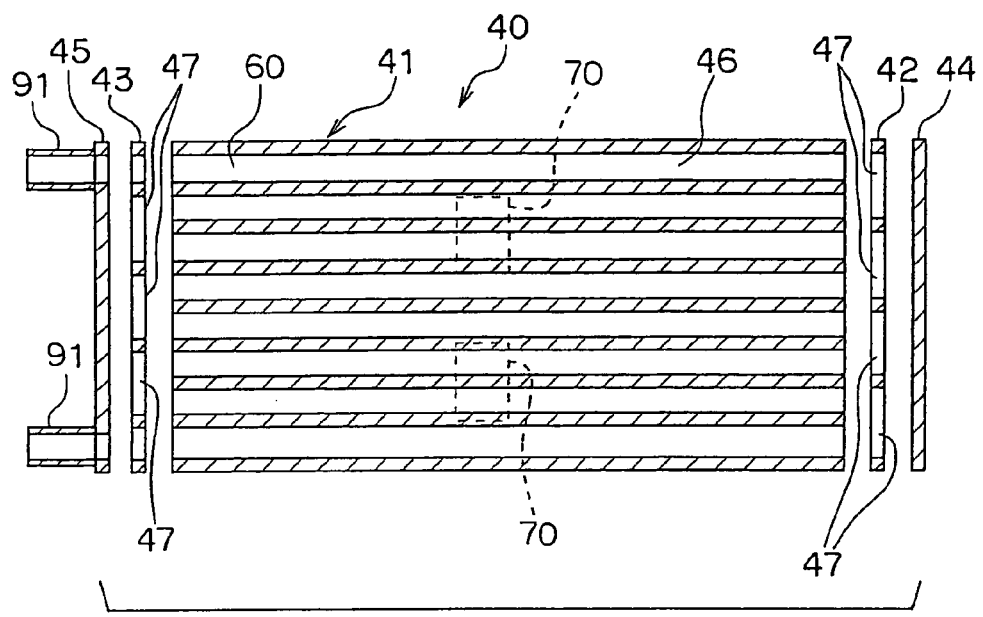
FIG. 41 is a view showing the main portion of the counter-stream-mode oscillating-flow heat transport apparatus 30 according to the twenty-second embodiment of the present invention.

In this embodiment, the present invention is applied to a cooling device for electronic components. FIG. 39 is a perspective view showing the outer appearance of a counter-stream-mode oscillating-flow heat transport apparatus according to this embodiment. FIGS. 40 and 41 are views showing the main portion of the counter-stream-mode oscillating-flow heat transport apparatus 30 according to this embodiment.

Referring to FIG. 39, a heat transport device assembly 40 formed generally in the shape of a strip plate has serpentine flow paths 60 (see FIG. 41) which are filled by a fluid and are provided generally at the longitudinal center on the plate surface with heat-generating elements 70 or heat sources which are to be cooled. The structure of the heat transport device assembly 40 will be discussed later. In this embodiment, the heat-generating element 70 is intended to represent electronic components such as integrated circuits for use in a computer.

In the heat transport device assembly 40, a heat sink 80 is provided on the plate surface opposite to the surface having the heat-generating elements 70. The heat sink 80 has a plurality of radiating fins 5a, each shaped into a thin plate to radiate the heat having been transported from the heat-generating elements 4, or a hot region, into the air, or a cold region. An oscillating device 6 acts as a pump means for inducing oscillations in the fluid in the heat transport device assembly 40 and is adapted to induce oscillations in the fluid by reciprocating a plunger which includes a movable element to be displaced by an electromagnetic force and a piston for creating oscillations in the fluid. This embodiment employs water as the fluid occupying the flow paths 60; however, a type of water that is mixed with an additive to reduce the viscosity thereof may also be utilized.

Now, the heat transport device assembly 40 will be described with reference to FIGS. 40 and 41. The heat transport device assembly 40 is formed by joining together the multi-hole tube 41 and first and second plates 42 to 45 which are made of a high thermal conductivity metal material such as copper or aluminum.

As used herein, the term "brazing" refers to a technique for joining materials together using a brazing material or solder without melting a base material, for example, as described in the "Bonding and Jointing Techniques" (Tokyo Denki University Press). More specifically, "brazing" refers to jointing using a filler metal having a melting point of 450° C. or greater while the filler metal employed for this purpose is referred to as the brazing material. "Soldering" refers to jointing using a filler metal having a melting point of 450° C. or less while the filler metal employed for this purpose is referred to as the solder.

The multi-hole tube 41 is a flat tube that is shaped by an extrusion process or a drawing process and contains therein a plurality of holes 46 which are provided at the same time as shaping and which penetrate from one end to the other end along the length of the tube. The first plates 42, 43 are provided with through-holes 47 for allowing adjacent holes 46 to communicate with each other and are fabricated by pressing a clad material having front and rear surfaces coated with a filler metal (e.g. a brazing material).

The second plates 44, 45 are intended to block the through-holes 47 at the side of the first plates 42, 43 opposite to the multi-hole tube 41. The second plates 44, 45 are fabricated by pressing a non-clad material in this embodiment. The first plates 42, 43 are sandwiched between the second plates 44, 45 and the multi-hole tube 41 at the longitudinal ends of the multi-hole tube 41, respectively, to join the multi-hole tube 41 and the first and second plates 42 to 45 together, thereby forming the heat transport device assembly 40 having serpentine flow paths 60.

In this embodiment, since the oscillating device 90 is connected to the left side, with respect to the page, the second plate 45 is connected with joint pipe portions 91 for coupling the oscillating device 90 to the heat transport device assembly 40.

Now, general operation of the counter-stream-mode oscillating-flow heat transport apparatus 30 according to this embodiment will be described below. When the oscillating device 90 induces oscillations in a fluid within the flow paths 60 (the heat transport device assembly 40), heat is exchanged between the fluids present in adjacent flow paths 60. Thus, the heat from the heat-generating elements 70, disposed generally at the center of the length of the heat transport device assembly 40, is transported towards the longitudinal ends of the heat transport device assembly 40, and spreads throughout the heat transport device assembly 40. The heat spread throughout the heat transport device assembly 40 is released into the air via the heat sink 80.

Figure 48:
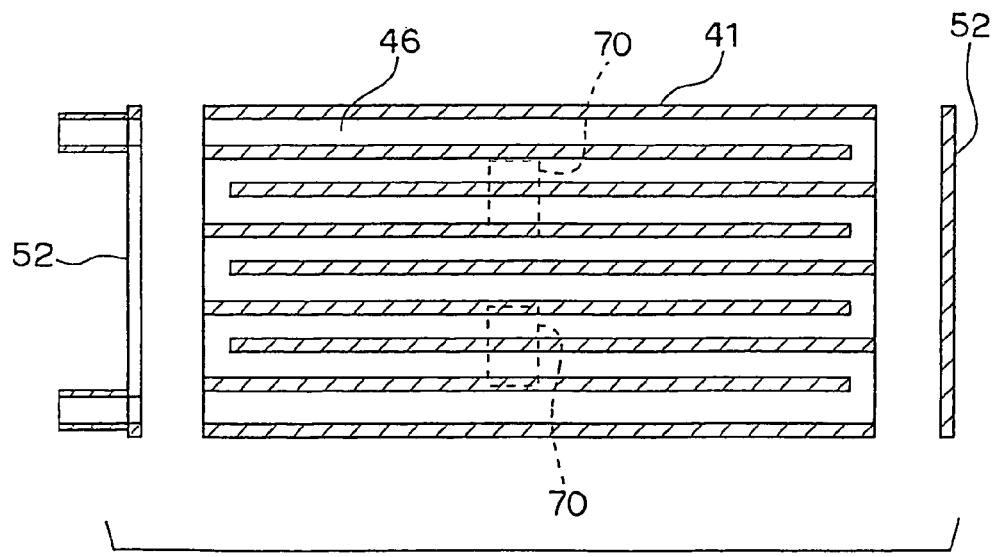
FIG. 48 is an exploded view showing the heat transport device assembly according to a second manufacturing method of the prior art.

Now, the operation and effect of this embodiment will be described below. In this embodiment, the multi-hole tube 41 having a plurality of holes 46 formed to penetrate from one end to the other end along the length of the tube, and the second plates 44, 45 for blocking the first plates 42, 43 having the through-holes 47, which allow adjacent holes 46 to communicate with each other, are joined together, thereby constituting the heat transport device assembly 40 having serpentine flow paths 60. For this reason, it is possible to reduce the manufacturing cost of the heat transport device assembly 40 when compared with the counter-stream-mode oscillating-flow heat transport apparatus having the structure as shown in FIGS. 48 and 49.

Twenty-third Embodiment

Figure 42:
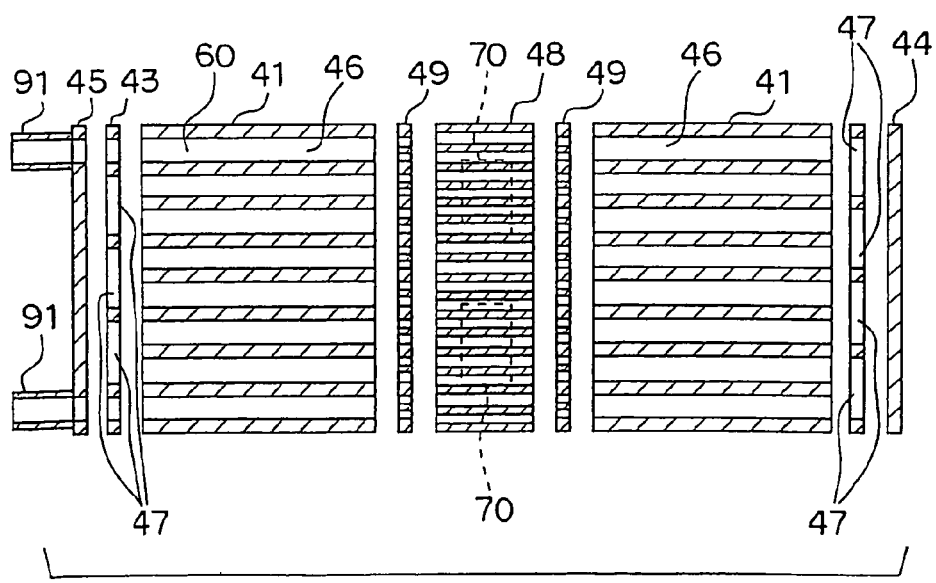
FIG. 42 is a view showing the main portion of a counter-stream-mode oscillating-flow heat transport apparatus according to a twenty-third embodiment of the present invention.

As shown in FIG. 42, this embodiment allows the pitch of those adjacent holes 46 located at a portion where the heat-generating elements 70 are attached to the heat transport device assembly 40 to be less than that of the adjacent holes 46 located at the other portions, thereby increasing the heat transfer coefficient and heat transfer area to provide improved heat absorption and dissipation capability. In this context, this embodiment is designed to join together two types of multi-hole tubes 41, 48 having different pitches, thereby allowing the pitch of the holes located at a portion, to which the heat-generating elements 70 are attached, to be less than that of the holes located at the other portions.

In this embodiment, the multi-hole tubes 41, 48 are both fabricated by an extrusion process or by a drawing process, thus making it difficult to provide a filler metal to the multi-hole tubes 41, 48. Accordingly, there is disposed a joint plate 49 clad with a filler metal on both the front and rear surfaces thereof between the multi-hole tube 41 and the multi-hole tube 48, thereby joining the multi-hole tubes 41, 48 together.

Twenty-fourth Embodiment

Figure 43:
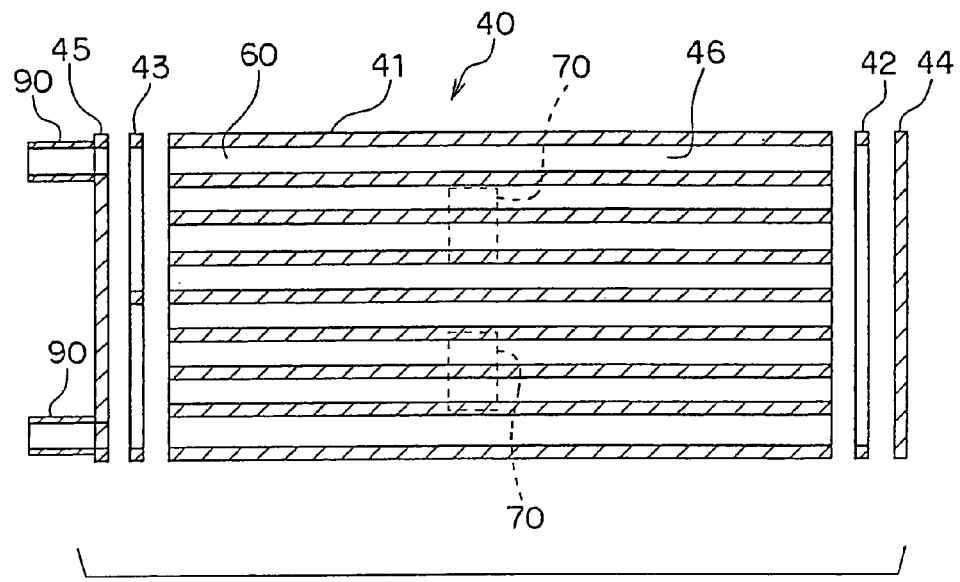
FIG. 43 is a view showing the main portion of a counter-stream-mode oscillating-flow heat transport apparatus according to a twenty-fourth embodiment of the present invention.

As shown in FIG. 43, this embodiment is different from the twenty-second and twenty-third embodiments in that the flow paths 60 (the heat transport device assembly 40) have a larger serpentine pitch (serpentine cycle). That is, the flow paths 60, according to this embodiment, make a U-turn once on the right side, with respect to the page, whereas the flow paths 60 according to the twenty-second and twenty-third embodiments (see FIGS. 41 and 42) make U-turns four times on the right side, with respect to the page.

Twenty-fifth Embodiment

Figure 44:
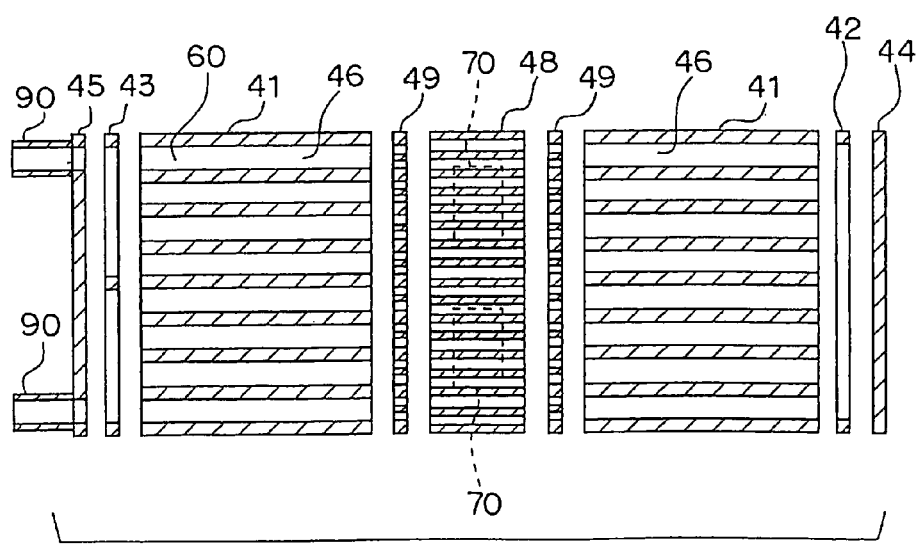
FIG. 44 is a view showing the main portion of a counter-stream-mode oscillating-flow heat transport apparatus according to a twenty-fifth embodiment of the present invention.

As shown in FIG. 44, this embodiment is designed such that the twenty-third embodiment is applied to the heat transport device assembly 40 according to the twenty-fourth embodiment. More specifically, the flow paths 60 make a U-turn once on the right side, with respect to the page, and the pitch of those adjacent holes 46 located at a portion to which the heat-generating elements 70 are attached is less than that of the adjacent holes 46 located at the other portions.

Twenty-sixth Embodiment

Figure 45:
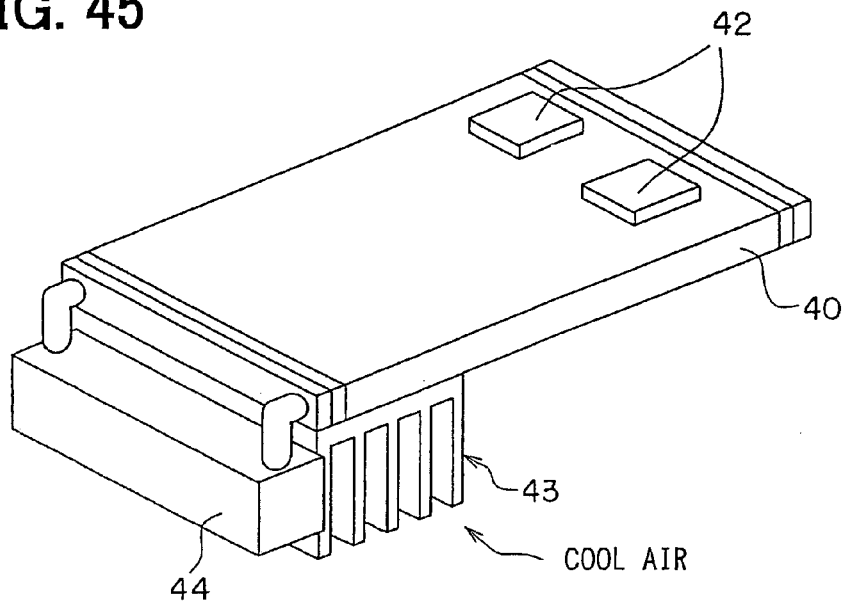
FIG. 45 is a perspective view showing the outer appearance of a counter-stream-mode oscillating-flow heat transport apparatus according to a twenty-sixth embodiment of the present invention.
Figure 46:
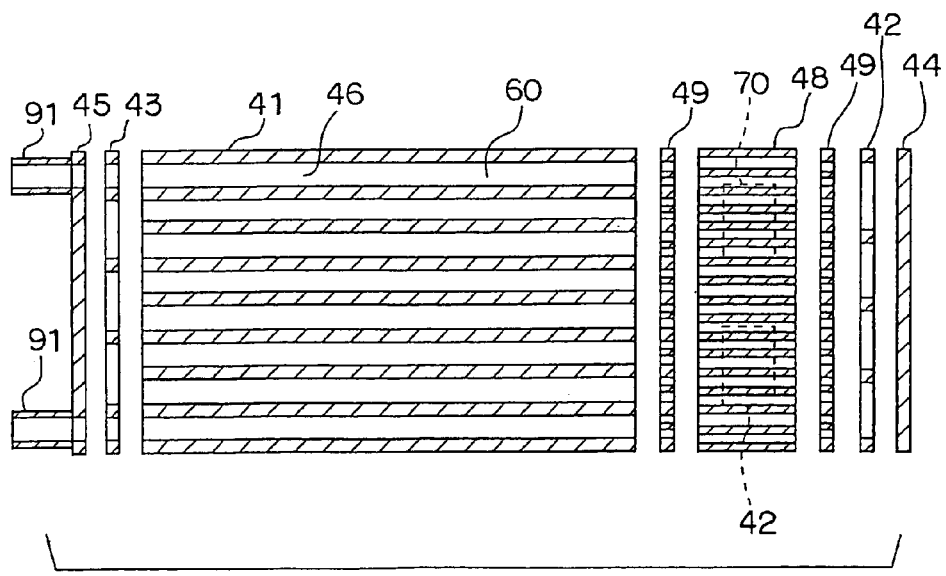
FIG. 46 is a view showing the main portion of the counter-stream-mode oscillating-flow heat transport apparatus according to the twenty-sixth embodiment of the present invention.
Figure 47:
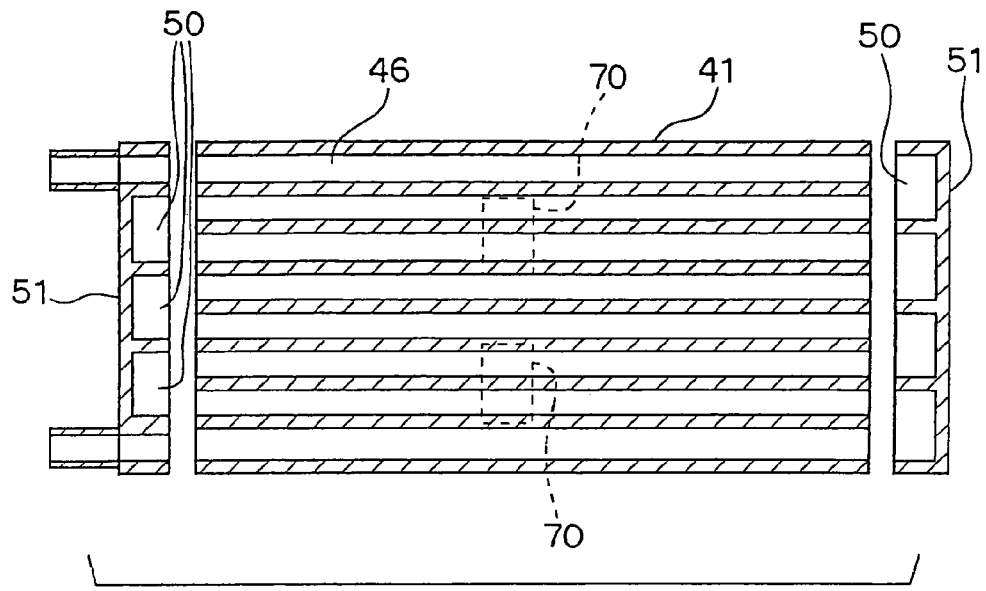
FIG. 47 is an exploded view showing the heat transport device assembly according to a first manufacturing method of the prior art.

As shown in FIGS. 45 and 46, this embodiment is designed such that the heat-generating elements 70 are disposed at a longitudinal end of the heat transport device assembly 40 while the heat sink 80 is disposed only at the other longitudinal end of the heat transport device assembly 40.

That is, when the oscillating device 90 induces oscillations of counterflow fluids in the flow paths 60, the heat from the heat-generating elements 70 transfers away from the heat-generating elements 70. In this context, this embodiment allows the heat-generating elements 70 to be disposed at a longitudinal end of the heat transport device assembly 40 and the heat sink 80 to be disposed at the other longitudinal end of the heat transport device assembly 40, thereby making it possible to efficiently cool the heat-generating elements 70 while reducing the manufacturing cost of the counter-stream-mode oscillating-flow heat transport apparatus 30.

Other Embodiments

In the aforementioned embodiments, the first plates 42, 43 are made of a clad material having the front and rear surfaces coated with a filler metal, however, the present invention is not limited thereto. For example, the first plates 42, 43 and the second plates 44, 45 may be made of a clad material having only one side coated with a filler metal. Additionally, the multi-hole tube 41 and the first plates 42, 43 may be brazed with the filler metal of the first plates 42, 43, while the first plates 42, 43 and the second plates 44, 45 may be brazed with the filler metal of the second plates 44, 45.

Furthermore, in the aforementioned embodiments, the brazing was performed using the filler metal coated on the clad material; however, the present invention is not limited thereto. For example, the filler metal may be sprayed or applied to the brazed face, or alternatively, a brazing sheet may be disposed at the brazed face, thereby eliminating the joint plate 49.

On the other hand, in the aforementioned embodiments, the plate surfaces of the radiating fins 81 are generally parallel to the flow of cooling air while the oscillating device 90 is disposed at a position displaced from the flow of the cooling air passing through the heat sink 80, but the present invention is not limited thereto.

The description of the invention is merely exemplary in nature and, thus, variations that do not depart from the gist of the invention are intended to be within the scope of the invention. Such variations are not to be regarded as a departure from the spirit and scope of the invention.

What is claimed is:
1. A heat transport apparatus comprising:
a heat source having a generally planar plate surface;
a heat transport member defining therein a continuously provided heat-transport passage in which a fluid is sealed, the heat transport member having a heat exchange portion configured to absorb heat from the heat source; and
an oscillating member configured to oscillate the fluid in the heat-transport passage, wherein:

the heat exchange portion has a contact surface that contacts the planar plate surface of the heat source the heat transport member has approximately an L shape in cross-section, which includes a perpendicular portion extending from the contact surface to be generally perpendicular to the planar plate surface, a parallel portion extending generally parallel with the planar plate surface, and a bent portion bent from the perpendicular portion to the parallel portion; and the heat-transport passage is U-turned at the heat exchange portion to have adjacent passage portions directly communicating with the heat exchange portion, and the adjacent passage portions are configured in contact with each other to perform a heat exchange therebetween;

the heat transfer member includes a plurality of the heat transport members having L-shapes in cross section that have different dimensions in the perpendicular portions and the parallel portions and are stacked with each other in the L-shapes to define plural heat-transport passages, the heat exchange portion of each of the heat transport members is configured to contact the planar plate surface at the contact surface; and the passage portions of adjacent heat-transport passages are in contact with each other.

2. The heat transport apparatus according to claim 1, wherein:

the continuously provided heat-transport passage is U-turned to form a plurality of the heat exchange portions that are arranged in an arrangement direction parallel to the planar plate surface;

the adjacent passage portions are provided for each heat exchange portion; and the passage portions of adjacent heat exchange portions are in contact with each other to perform a heat exchange therebetween.

3. A heat transport apparatus comprising:

a heat source having a generally planar plate surface;

a heat transport member defining therein a continuously provided heat-transport passage in which a fluid is sealed, the heat transport member having a heat exchange portion configured to absorb heat from the heat source; and an oscillating member configured to oscillate the fluid in the heat-transport passage, wherein:

the heat exchange portion has a contact surface that contacts the planar plate surface of the heat source;

the heat transport member has approximately an L shape in cross-section, which includes a perpendicular portion extending from the contact surface to be generally perpendicular to the planar plate surface, a parallel portion extending generally parallel with the planar plate surface, and a bent portion bent from the perpendicular portion to the parallel portion;

the heat-transport passage is U-turned at the heat exchange portion to have adjacent passage portions directly communicating with the heat exchange portion, and the adjacent passage portions are configured in contact with each other to perform a heat exchange therebetween;

the heat transport member includes a plurality of the heat transport members having L-shapes in cross section that have different dimensions in the perpendicular portions and the parallel portions and are stacked with each other in the L-shapes to define plural heat-transport passages;

each of the heat transport members is configured to contact the planar plate surface at the contact surface;

the passage portions of adjacent heat-transport passages are configured in contact with each other;

the heat-transport passage in each heat transport member is U-turned at plural times to form a plurality of the heat exchange portions that are arranged in an arrangement direction parallel to the planar plate surface;

the adjacent passage portions are provided for each heat exchange portion in each heat-transport passage; and the passage portions of adjacent two of the heat exchange portions are configured in contact with each other.

4. The heat transport apparatus according to claim 1, wherein each of the heat-transport passages has approximately an L shape.

5. An assembly comprising a pair of the heat transport apparatus according to claim 1, wherein the pair of the heat transport apparatus are line-symmetrical to each other.

* * * * *